US012631668B2

(12) United States Patent
Franke

(10) Patent No.: US 12,631,668 B2
(45) Date of Patent: May 19, 2026

(54) SENSOR DEVICE AND SENSOR ARRANGEMENT FOR DETERMINING AN ELECTRICALLY INDUCED MAGNETIC FIELD

(71) Applicant: TDK—Micronas GmbH, Freiburg (DE)

(72) Inventor: Jorg Franke, Freiburg (DE)

(73) Assignee: TDK—Micronas GmbH, Freiburg (DE)

( * ) Notice: Subject to any disclaimer, the term of this patent is extended or adjusted under 35 U.S.C. 154(b) by 209 days.

(21) Appl. No.: 18/453,619

(22) Filed: Aug. 22, 2023

(65) Prior Publication Data

US 2024/0061022 A1     Feb. 22, 2024

(30) Foreign Application Priority Data

Aug. 22, 2022    (DE) ..................... 10 2022 121 177.0

(51) Int. Cl.
*G01R 15/20*          (2006.01)
(52) U.S. Cl.
CPC .................................. *G01R 15/207* (2013.01)
(58) Field of Classification Search
CPC ... G01R 15/207; G01R 33/0011; G01R 33/02
See application file for complete search history.

(56) References Cited

U.S. PATENT DOCUMENTS

| | | | |
|---|---|---|---|
| 5,041,780 A | 8/1991 | Rippel | |
| 9,176,170 B2 * | 11/2015 | Racz ..................... | G01R 15/207 |
| 11,385,301 B2 * | 7/2022 | Hoegerl ............. | G01R 33/0005 |
| 2003/0001559 A1 * | 1/2003 | Goto .................... | G01R 15/202 |
| | | | 324/117 H |
| 2015/0323568 A1 * | 11/2015 | Schmitt ................ | G01R 15/205 |
| | | | 324/126 |
| 2016/0299176 A1 * | 10/2016 | Nakayama ........... | G01R 15/148 |
| 2017/0003323 A1 * | 1/2017 | Nakayama ............ | H02M 7/003 |
| 2022/0018880 A1 * | 1/2022 | Houis .................... | G01R 19/10 |
| 2022/0091161 A1 * | 3/2022 | Houis ................ | G01R 19/0007 |
| 2024/0036082 A1 * | 2/2024 | Lehmann .............. | B60L 3/0046 |

FOREIGN PATENT DOCUMENTS

DE      10 2014 113 313 B4     9/2017

* cited by examiner

*Primary Examiner* — Dominic E Hawkins
(74) *Attorney, Agent, or Firm* — 24IP Law Group USA, PLLC; Timothy R DeWitt

(57) ABSTRACT

A sensor device and a sensor arrangement for determining an electrically induced magnetic field are disclosed. The sensor device includes a busbar and a first magnetic field sensor arranged on the first busbar surface. The busbar has a busbar longitudinal axis, a first busbar surface, a first recess, and a second recess. The first recess and the second recess extend substantially orthogonal to the first busbar surface. The first recess and the second recess are spaced apart from each other along the busbar longitudinal axis. The first magnetic field sensor is arranged on the first busbar surface between the first recess and the second recess using an/the entire surface of the first magnetic field sensor facing the first busbar surface.

12 Claims, 12 Drawing Sheets

SENSOR DEVICE AND SENSOR ARRANGEMENT FOR DETERMINING AN ELECTRICALLY INDUCED MAGNETIC FIELD

CROSS-REFERENCE TO RELATED APPLICATIONS

This application claims priority of German Patent Application number DE 10 2022 121 177.0, filed on 22 Aug. 2022. The entire disclosure of the of German Patent Application number DE 10 2022 121 177.0 is hereby incorporated herein by reference.

TECHNICAL FIELD OF THE INVENTION

The invention relates to a device for determining an electrically induced magnetic field by means of a sensor arrangement which comprises a busbar.

BACKGROUND OF THE INVENTION

Various devices are proposed for measurement of a magnetic field generated around a current-carrying conductor in the prior art. These devices use sensors of various types to measure a strength of the electrically induced magnetic field. The measurement of the magnetic field allows galvanically decoupled (isolated) measurement of the current in the conductor. The conductor sections provided for this purpose are also referred to as busbars.

U.S. Pat. No. 5,041,780 A describes a current sensor which preferably comprises two connected flux sensor elements arranged on opposite sides of a busbar. The flux sensor elements are arranged in a region of the busbar which is shaped in such a way that the electrical flux is concentrated between these flux sensor elements. This concentration of the electrical current enables improving the measuring accuracy of the current sensor.

German patent specification DE 10 2014 113 313 B4 describes a current sensor device for detecting a measuring current. The current sensor device has a semiconductor chip, a conductor, and a redistribution structure. The semiconductor chip comprises a magnetic field sensitive element and is disposed electrically insulated on the conductor. The magnetic field sensitive element is adapted to detect a magnetic field generated by a current flowing through a conductor.

SUMMARY OF THE INVENTION

In view of the above, a sensor device and a sensor arrangement for determining an electrically induced magnetic field are provided. The sensor device comprises a busbar or power rail or conductor rail and a first magnetic field sensor arranged on the first busbar surface. The busbar has a busbar longitudinal axis, a first busbar surface, a first recess, and a second recess. The first recess and the second recess extend substantially orthogonal to the first busbar surface. The first recess and the second recess are spaced apart from each other along the busbar longitudinal axis. The first magnetic field sensor is arranged on the first busbar surface between the first recess and the second recess using an/the entire surface of the magnetic field sensor facing the first busbar surface.

The configuration of the first recess and the second recess can increase the current density in the busbar in the region/area of the magnetic field sensor. By arranging the first magnetic field sensor on the first busbar surface, a measurement of the electrically induced magnetic field can be improved. Furthermore, by arranging the first magnetic field sensor on the first busbar surface, a detection of disturbances during the measurement of the electrically induced magnetic field can be avoided.

In one aspect, the busbar has a second busbar surface which is substantially orthogonal to the first busbar surface.

The orthogonal arrangement of the second busbar surface allows the busbar to be manufactured easily.

In another aspect, the second busbar surface extends substantially parallel to the busbar longitudinal axis.

The parallel extending of the second busbar surface allows the busbar to be manufactured easily.

In another aspect, the first recess and the second recess extend substantially orthogonal to the busbar longitudinal axis.

The orthogonal extending of the first recess and the second recess allows to increase the current density in the region of the magnetic field sensor. This enables an improved detection of the electrically induced magnetic field. Furthermore, by increasing the current density in the region of the magnetic field sensor, the detection of disturbances or disturbing signals during the measurement of the electrically induced magnetic field can be avoided. The orthogonal extending of the first recess and the second recess allows the electrically induced magnetic field to be oriented by approximately 90° rotated with respect to the busbar. This rotated orientation of the electrically induced magnetic field enables the emission of the disturbance in the region of the magnetic field sensor to be reduced and thereby allows to reduce the disturbance in the measurement of the electrically induced magnetic field in further, adjacent busbars.

In another aspect, the first recess and the second recess are substantially parallel to each other.

The parallel arrangement of the first recess and the second recess may increase the current density in the region of the magnetic field sensor. This enables an improved detection of the electrically induced magnetic field. Furthermore, by increasing the current density in the region of the magnetic field sensor, the detection of disturbances during the measurement of the electrically induced magnetic field can be avoided. Due to the parallel arrangement of the first recess and the second recess, the electrically induced magnetic field can be specifically aligned relative to the busbar. This specific alignment of the electrically induced magnetic field enables the emission of the disturbance in the region of the magnetic field sensor to be reduced and thereby allows to reduce the disturbance in the measurement of the electrically induced magnetic field in further, adjacent busbars.

In another aspect, the first recess has a first recess length. The second recess has a second recess length.

The configuration of the first recess and the second recess may increase the current density in the region of the magnetic field sensor. This enables improved detection of the electrically induced magnetic field. Furthermore, by increasing the current density in the region of the magnetic field sensor, a detection of disturbances during the measurement of the electrically induced magnetic field can be avoided.

In another aspect, a sum of the first recess length and the second recess length is greater than a busbar width of the busbar, wherein the busbar width is defined orthogonal to the busbar longitudinal axis.

The configuration of the first recess and the second recess may increase the current density in the region of the magnetic field sensor. This enables an improved detection of the electrically induced magnetic field. Furthermore, by increasing the current density in the region of the magnetic field sensor, a detection of disturbances during the measurement of the electrically induced magnetic field can be avoided.

In another aspect, the sensor device further comprises a third recess. The third recess extends substantially orthogonal to the first busbar surface. The third recess is spaced apart from the first recess and the second recess along the busbar longitudinal axis.

The third recess allows a region of increased current density to be further enlarged. This enables improved detection of the electrically induced magnetic field.

In another aspect, the sensor device further comprises a second magnetic field sensor arranged on the first busbar surface. The second magnetic field sensor is arranged on the first busbar surface between the third recess and the second recess or between the second recess and the first recess using an/the entire surface of the second magnetic field sensor facing the first busbar surface.

By using the second magnetic field sensor, it is possible to perform a differential measurement of the magnetic field strength. In addition, in the event of a failure or malfunction of one of the first magnetic field sensor or the second magnetic field sensor, it is still possible to perform a measurement of the magnetic field strength of the magnetic field.

In another aspect, in the sensor device, at least one of the first magnetic field sensor and the second magnetic field sensor comprises at least one of a Hall sensor element (vertical or horizontal), a magnetoresistive sensor element, or a fluxgate sensor element.

By using different sensors, the sensor device can be adapted for different application purposes.

In another aspect, the busbar of the sensor device is integrally formed.

The configuration of the busbar in one piece allows the busbar to be manufactured easily.

In another aspect, the sensor arrangement for determining an electrically induced magnetic field comprises a first busbar, a second busbar, and a first magnetic field sensor arranged on at least one of the first busbar surface of the first busbar or the first busbar surface of the second busbar.

By disposing the first magnetic field sensor on at least one of the first busbar surface of the first busbar or the first busbar surface of the second busbar, an electrically induced magnetic field in at least one of the first busbar or the second busbar can be determined.

In another aspect, the first busbar has a busbar longitudinal axis, a first busbar surface, and at least a first recess and a second recess. The first recess and the second recess extend substantially orthogonal to the busbar surface. The first recess and the second recess are spaced apart from each other along the busbar longitudinal axis.

The configuration of the first recess and the second recess may increase the current density in the busbar in the region of the magnetic field sensor.

In another aspect, the second busbar has a busbar longitudinal axis, a first busbar surface, and at least a third recess and a fourth recess. The third recess and the fourth recess extend substantially orthogonal to the first busbar surface. The third recess and the fourth recess are spaced apart from each other along the busbar longitudinal axis.

The configuration of the third recess and the fourth recess may increase the current density in the busbar in the region of the magnetic field sensor.

In another aspect, the first magnetic field sensor is arranged on the first busbar surface of the first busbar using an/the entire surface of the first magnetic field sensor facing the first busbar, or is arranged on the first busbar surface of the second busbar using an/the entire surface of the first magnetic field sensor facing the first busbar surface of the second busbar.

By arranging the first magnetic field sensor on the first busbar surface, a measurement of the electrically induced magnetic field can be improved. Furthermore, by arranging the first magnetic field sensor on the first busbar surface, a detection of disturbances during the measurement of the electrically induced magnetic field can be avoided. Hereby, crosstalk is reduced.

In another aspect, the first recess and the second recess extend substantially orthogonal to the first busbar longitudinal axis. The third recess and the fourth recess extend substantially orthogonal to the second busbar longitudinal axis.

The orthogonal arrangement of the first recess, the second recess, the third recess, and the fourth recess can improve a measurement of the electrically induced magnetic field. In addition, the arrangement of the first recess, the second recess, the third recess, and the fourth recess reduces crosstalk. By extending the first recess and the second recess orthogonal, the electrically induced magnetic field in the first busbar can be aligned orthogonal to the first busbar. By extending the third recess and the fourth recess orthogonal, the electrically induced magnetic field in the second busbar can be aligned orthogonal to the second busbar. This orthogonal alignment of the electrically induced magnetic field enables reducing disturbances in the measurement of the electrically induced magnetic field.

In another aspect, the first recess extends substantially parallel to the second recess and the third recess extends substantially parallel to the fourth recess.

By arranging the first recess, the second recess, the third recess, and the fourth recess parallel, a measurement of the electrically induced magnetic field can be improved. In addition, the parallel arrangement of the first recess, the second recess, the third recess, and the fourth recess reduces crosstalk. The parallel arrangement of the first recess and the second recess allows the electrically induced magnetic field to be selectively aligned relative to the first busbar. The parallel arrangement of the third recess and the fourth recess allows the electrically induced magnetic field to be selectively aligned relative to the second busbar. This selective alignment of the electrically induced magnetic field enables reducing disturbances in the measurement of the electrically induced magnetic field.

In another aspect, the first recess, the second recess, the third recess, and the fourth recess extend substantially parallel.

By arranging the first recess, the second recess, the third recess, and the fourth recess parallel, a measurement of the electrically induced magnetic field can be improved. In addition, the parallel arrangement of the first recess, the second recess, the third recess, and the fourth recess reduces crosstalk. Further, the parallel arrangement of the first recess, the second recess, the third recess, and the fourth recess selectively aligns the electrically induced magnetic field relative to the busbar.

In another aspect, the first recess and the third recess are arranged along a first axis and the second recess, and the fourth recess are arranged along a second axis.

By arranging the first recess and the third recess along a first axis, and the second recess and the fourth recess along a second axis, a measurement of the electrically induced magnetic field can be improved. In addition, the parallel arrangement of the first recess, the second recess, the third recess, and the fourth recess reduces crosstalk. Furthermore, the parallel arrangement of the first recess, the second recess, the third recess and the fourth recess aligns the electrically induced magnetic field. This alignment enables reducing disturbances in the measurement of the electrically induced magnetic field.

In another aspect, the first axis is parallel to second axis and the first axis is different from second axis.

By having the first axis and the second axis parallel and spaced apart from each other, a measurement of the electrically induced magnetic field can be improved. In addition, by arranging the first axis and the second axis parallel and spaced apart from each other, crosstalk is reduced. Furthermore, the parallel arrangement of the first axis and the second axis aligns the electrically induced magnetic field. This alignment enables reducing disturbances in the measurement of the electrically induced magnetic field.

In another aspect, the first magnetic field sensor comprises at least one of a Hall sensor element (vertical or horizontal), a magnetoresistive sensor element, or a fluxgate sensor element.

By using different sensors, the sensor device can be adapted for different application purposes.

In another aspect, a sensor device comprises a busbar having a first busbar section, a second busbar section, and a busbar intermediate section. The busbar intermediate section is arranged between the first busbar section and the second busbar section. The sensor device further comprises at least one first magnetic field sensor. The at least one first magnetic field sensor is arranged on the busbar intermediate section.

The configuration of the busbar may increase the current density locally in the busbar intermediate section.

In another aspect of the busbar, the first busbar section has a first busbar longitudinal axis. Further, the second busbar section has a second busbar longitudinal axis.

The configuration of the busbar may increase the current density locally in the busbar intermediate section.

In another aspect, the first busbar longitudinal axis and the second busbar longitudinal axis are substantially parallel to each other.

The configuration of the busbar may prevent crosstalk.

In another aspect, the busbar intermediate section has a busbar intermediate section longitudinal axis and a busbar intermediate section transverse axis. The busbar intermediate section longitudinal axis is substantially orthogonal to the first busbar longitudinal axis and the second busbar longitudinal axis. The busbar intermediate section transverse axis is substantially orthogonal to the busbar intermediate section longitudinal axis. The busbar intermediate section transverse axis is substantially orthogonal to the first busbar longitudinal axis and the second busbar longitudinal axis.

The configuration of the busbar may increase the current density locally in the busbar intermediate section.

In another aspect, the busbar intermediate section comprises a first recess. The first recess extends substantially along the busbar intermediate section transverse axis.

In another aspect, the busbar intermediate section further comprises a second recess. The second recess extends substantially along the busbar intermediate section transverse axis.

The configuration of the busbar can further increase the current density locally in the busbar intermediate section.

In another aspect, a sensor arrangement for determining an electrically induced magnetic field has a first busbar, a second busbar, and at least one first magnetic field sensor. The first busbar has a first busbar section, a second busbar section, and a busbar intermediate section. The busbar intermediate section is arranged between the first busbar section and the second busbar section. The second busbar has a first busbar section, a second busbar section, and a busbar intermediate section. The busbar intermediate section is arranged between the first busbar section and the second busbar section. The at least one first magnetic field sensor is arranged on at least one of the busbar intermediate section of the first busbar and the busbar intermediate section of the second busbar. Due to the configuration of the sensor arrangement, the current density in the region of the magnetic field sensor can be increased. This enables improved detection of the electrically induced magnetic field. Furthermore, by increasing the current density in the region of the magnetic field sensor, a detection of disturbances during the measurement of the electrically induced magnetic field can be avoided.

In another aspect of the sensor arrangement, the first busbar section of the first busbar has a first busbar longitudinal axis, the second busbar section of the first busbar has a second busbar longitudinal axis, the first busbar section of the second busbar has a first busbar longitudinal axis, and the second busbar section of the second busbar has a second busbar longitudinal axis.

The configuration of the sensor arrangement can increase the current density in the region of the magnetic field sensor. This enables an improved detection of the electrically induced magnetic field. Furthermore, by increasing the current density in the region of the magnetic field sensor, detection of disturbances during the measurement of the electrically induced magnetic field can be avoided.

In another aspect of the sensor arrangement, the first busbar longitudinal axis of the first busbar, the first busbar longitudinal axis of the second busbar, the second busbar longitudinal axis of the first busbar, and the second busbar longitudinal axis of the second busbar are substantially parallel to each other. Further, in the sensor arrangement, the first busbar longitudinal axis of the first busbar, the first busbar longitudinal axis of the second busbar, the second busbar longitudinal axis of the first busbar, and the second busbar longitudinal axis of the second busbar are different from each other.

The configuration of the sensor arrangement can increase the current density in the region of the magnetic field sensor. This enables an improved detection of the electrically induced magnetic field. Furthermore, by increasing the current density in the region of the magnetic field sensor, a detection of disturbances during the measurement of the electrically induced magnetic field can be avoided.

In another aspect of the sensor arrangement, the busbar intermediate section of the first busbar has a busbar intermediate section longitudinal axis and a busbar intermediate section transverse axis, the busbar intermediate section of the second busbar has a busbar intermediate section longitudinal axis and a busbar intermediate section transverse axis, wherein the busbar intermediate section longitudinal axis of the first busbar is substantially parallel to the busbar intermediate section longitudinal axis of the second busbar.

The configuration of the sensor arrangement may increase the current density in the region of the magnetic field sensor. This enables an improved detection of the electrically induced magnetic field. Furthermore, by increasing the current density in the region of the magnetic field sensor, detection of disturbances during the measurement of the electrically induced magnetic field can be avoided.

In another aspect of the sensor arrangement, the busbar intermediate section longitudinal axis of the first busbar is coincident with the busbar intermediate section longitudinal axis of the second busbar.

The configuration of the sensor arrangement may increase the current density in the region of the magnetic field sensor. This enables an improved detection of the electrically induced magnetic field. Furthermore, by increasing the current density in the region of the magnetic field sensor, detection of disturbances during the measurement of the electrically induced magnetic field can be avoided.

In another aspect, the sensor arrangement comprises at least one second magnetic field sensor, wherein the at least one second magnetic field sensor is arranged at the other one of the busbar intermediate section of the first busbar and the busbar intermediate section of the second busbar.

The configuration of the sensor arrangement may increase the current density in the region of the magnetic field sensor. This enables an improved detection of the electrically induced magnetic field. Furthermore, by increasing the current density in the region of the magnetic field sensor, detection of disturbances during the measurement of the electrically induced magnetic field can be avoided.

The sensor device as well as the sensor arrangement are used in a further aspect for determining an electrically induced magnetic field.

DETAILED DESCRIPTION OF THE INVENTION

The invention will now be described based on the drawings. It is understood that the embodiments and aspects of the invention described herein are examples only and in no way limit the scope of protection of the claims. The invention is defined by the claims and their equivalents. It is understood that features of one aspect or embodiment of the invention may be combined with a feature of another aspect or other aspects and/or embodiments of the invention.

Figure 1:
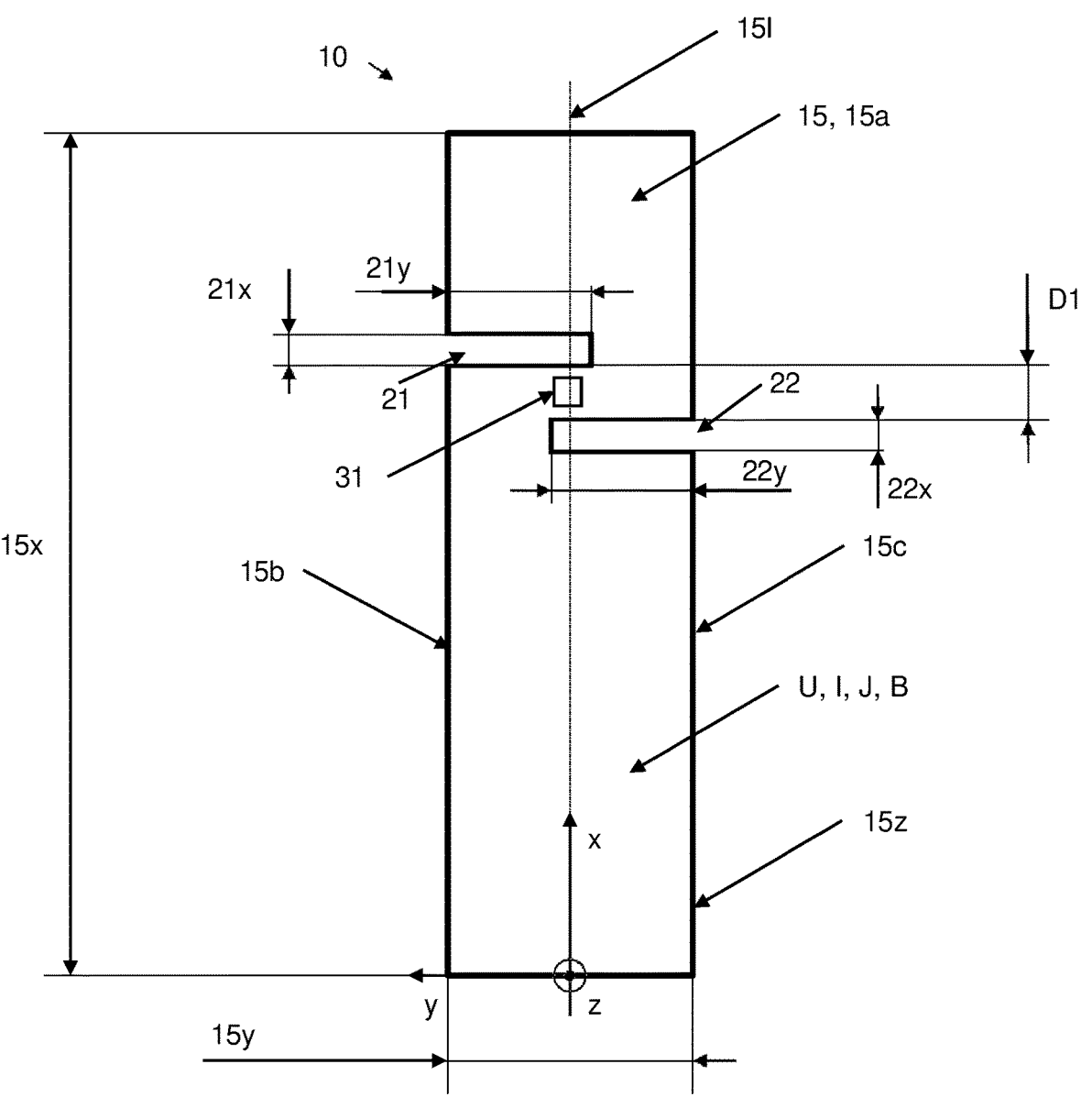
FIG. 1 shows an overview of a first aspect of a sensor device.

FIG. 1 shows an overview of a first aspect of a sensor device 10. The sensor device 10 of the first aspect comprises a busbar or power rail or conductor rail 15 and a first magnetic field sensor 31. The busbar 15 has a busbar longitudinal axis 151, a busbar length 15$x$, a busbar width 15$y$, a first busbar surface 15$a$, a second busbar surface 15$b$, and a third busbar surface 15$c$. The busbar longitudinal axis 151 is the central axis of the busbar 15 corresponding to an axis of the largest spatial extent of the busbar 15. The busbar longitudinal axis 151 extends parallel to an x-direction. The busbar length 15$x$ corresponds to a spatial extent of the busbar 15 in the x-direction. The busbar width 15$y$ corresponds to a spatial extent of the busbar 15 in a y-direction. The busbar thickness 15$z$ corresponds to a spatial extent of the busbar 15 in a z-direction.

The first busbar surface 15$a$ corresponds to the surface that comprises a largest surface area of the busbar 15 and is arranged in positive z-direction. The second busbar surface 15$b$ corresponds to the surface that is substantially orthogonal to the first busbar surface 15$a$ and arranged in positive y-direction. The second busbar surface 15$b$ extends substantially parallel to the busbar longitudinal axis 151. The third busbar surface 15$c$ corresponds to the surface arranged substantially orthogonal to the first busbar surface 15$a$. The third busbar surface 15$c$ extends substantially parallel to the busbar longitudinal axis 151.

The busbar 15 has at least a first recess 21 and a second recess 22. The first recess 21 has a first recess length 21$y$ and a first recess width 21$x$. The second recess 22 has a second recess length 22$y$ and a second recess width 22$x$. The first recess 21 and the second recess 22 extend substantially orthogonal to the busbar longitudinal axis 151. The first recess 21 and the second recess 22 are substantially parallel to each other. A sum of the first recess length 21$y$ and the second recess length 22$y$ is greater than the busbar width 15$y$.

The first recess 21 and the second recess 22 extend substantially orthogonal to the busbar longitudinal axis 151. The first recess 21 and the second recess 22 are spaced apart from each other along the busbar longitudinal axis 151 by a distance D1.

Figure 2:
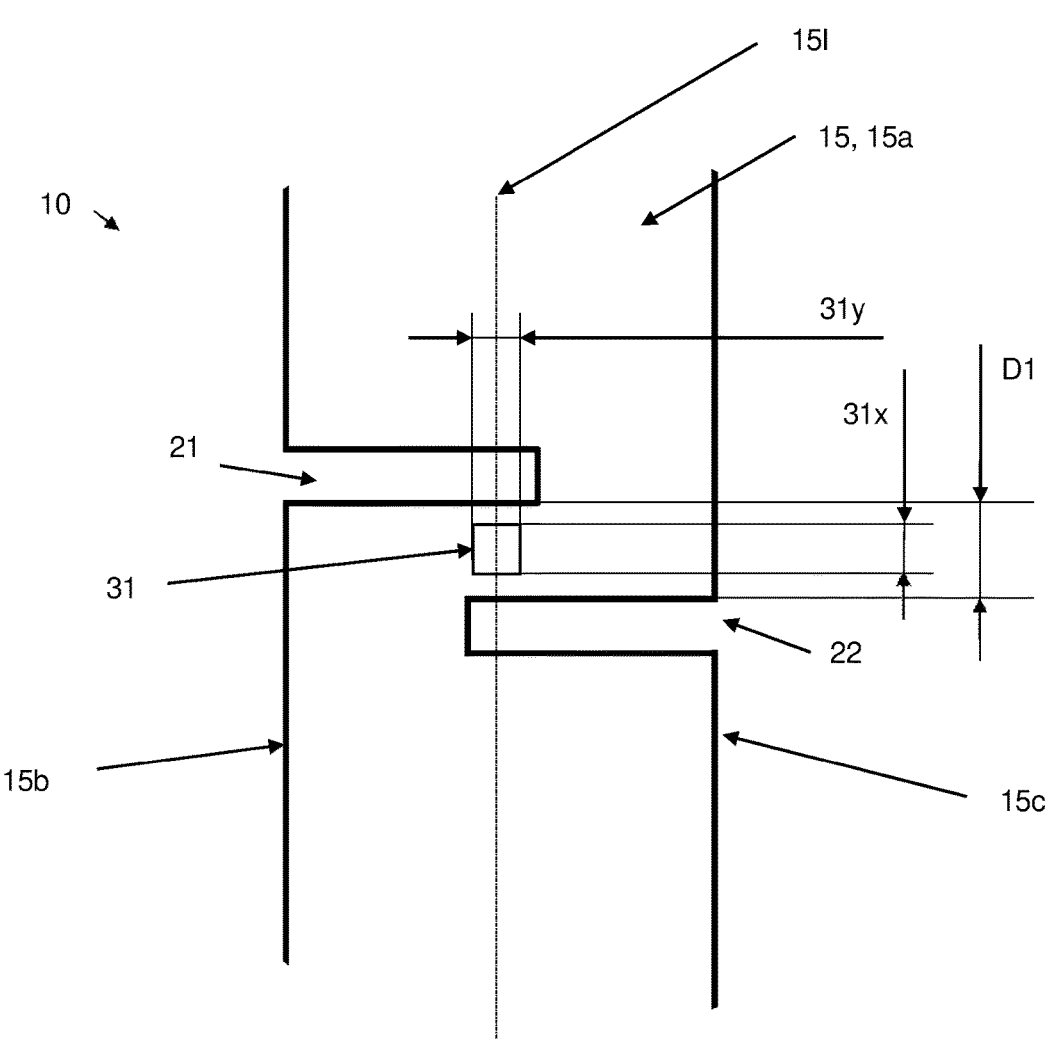
FIG. 2 shows an enlarged section of the first aspect of the sensor device shown in FIG. 1.

FIG. 2 shows an enlarged section of the first aspect of the sensor device 10 shown in FIG. 1. The first magnetic field sensor 31 has a first magnetic field sensor length 31$x$ and a first magnetic field sensor width 31$y$. The first magnetic field sensor 31 comprises, for example, a Hall sensor element (vertical or horizontal), a magnetoresistive sensor element, or a fluxgate sensor element. The sensor element may be a vertically (Bz) or laterally (By) measuring sensor element. For example, a magnetoresistive sensor element such as AMR, GMR and/or TMR, a fluxgate sensor element or a Weigand sensor element can act as a laterally measuring sensor element. For redundancy reasons, the sensor element may also comprise a plurality of sensor elements. The first magnetic field sensor 31 is arranged on the first busbar surface 15$a$ between the first recess 21 and the second recess 22 using an/the entire surface of the first magnetic field sensor 31 facing the first busbar surface 15$a$. Due to the location of the recesses 21, 22, the busbar 15 is also referred to as a "single S-shaped notched busbar".

The first magnetic field sensor 31 is preferably arranged between the first recess 21 and the second recess 22 in the first aspect of the sensor device 10. Preferably, a sum of the first recess length 21*y*, the second recess length 22*y*, and the first magnetic field sensor width 31*y* is equal to or greater than the busbar width 15*y*. For example, a ratio of the first recess length 21*y*, the second recess length 22*y*, the busbar width 15*y*, the first magnetic field sensor width 31*y*, and the distance D1 may be as described in the following equations.

for 31*y*<<*D*1 it is valid: 21*y*+22*y*–*D*1=15*y* for 31*y*≥*D*1 it is valid: 21*y*+22*y*–31*y*=15*y*

A voltage U is applied to the busbar 15. For example, this voltage U is applied in the negative x-direction of the busbar. In response to the voltage U applied to the busbar 15, a current I flows in the busbar 15. A magnetic field B is induced by the current I flowing in the busbar 15. A magnetic field strength of the magnetic field B depends on a current strength of the current I.

The busbar 15 has a cross section 15Q. The cross section 15Q of the busbar 15 is substantially constant along the busbar 15. In the region of the first recess 21 and the second recess 22, and in the region between the first recess 21 and the second recess 22, the cross-section 15Q of the busbar 15 is reduced by the first recess 21 and the second recess 22.

This reduction in the cross section 15Q of the busbar 15 is a local reduction in the cross-sectional area 15Q relative to an initial cross section 15Q of the busbar 15 in the region away from the first recess 21 and the second recess 22. This narrowing/tapering of the busbar 15 in the region of the first recess 21 and the second recess 22, and in the region between the first recess 21 and the second recess 22, locally produces an increased current density J. The current density J is defined as the quotient of the current I and the cross-sectional area 15Q at a respective position of the busbar 15.

In the region of the increased current density J, the magnetic field strength of the magnetic field B is increased. In the first aspect of the sensor device 10, the first magnetic field sensor 31 is arranged in the region of the increased magnetic field strength. Preferably, the first magnetic field sensor 31 is arranged centrally between the first recess 21 and the second recess 22, when viewed along the x-axis. Preferably, the first magnetic field sensor 31 is arranged centrally in the region between an end of the first recess 21 projecting into the busbar 15 and an end of the second recess 22 projecting into the busbar 15, when viewed along the y-axis. This arrangement of the first magnetic field sensor 31 increases an accuracy of a measurement of the magnetic field strength of the magnetic field B. Using the determined magnetic field strength, for example, conclusions can be drawn about a current I flowing in the busbar 15. This can improve a relative measurement result signal/noise, signal/offset or signal/extraneous field. The extraneous field may be, for example, an earth magnetic field, a magnetic field generated by an adjacent current carrying conductor, or a magnetic field generated by a magnetic source.

Figure 3:
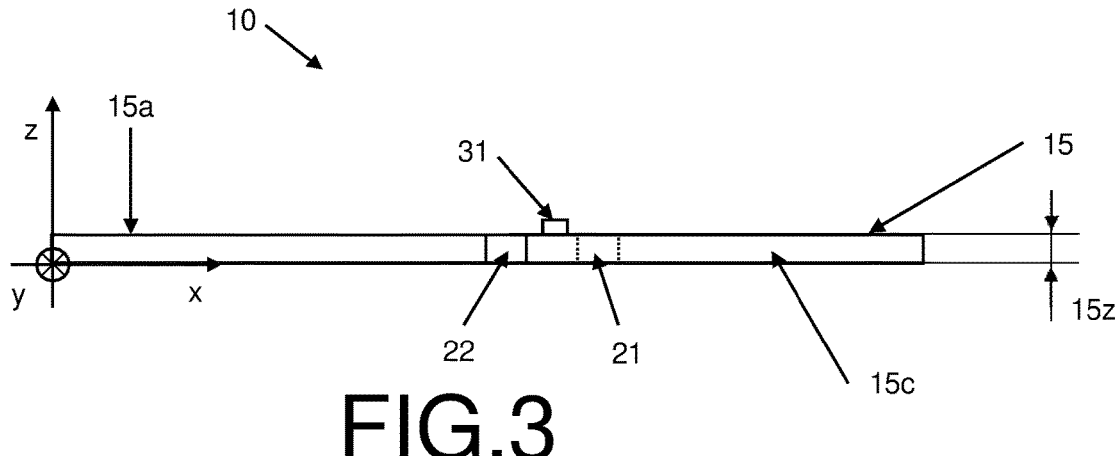
FIG. 3 shows a side view of the first aspect of the sensor device shown in FIG. 1 and FIG. 2.

FIG. 3 shows a side view of the first aspect of the sensor device 10 shown in FIG. 1 and FIG. 2. The first magnetic field sensor 31 is arranged on the first busbar surface 15*a* between the first recess 21 and the second recess 22 using an/the entire surface of the first magnetic field sensor 31 facing the first busbar surface 15*a*. The surface of the first magnetic field sensor 31 facing the first busbar surface 15*a* may be in direct contact with the first busbar surface 15*a*. The surface of the first magnetic field sensor 31 facing the first busbar surface 15*a* may also be in contact with the first busbar surface 15*a* using an additional element (not shown). The additional element comprises, for example, a dielectric. For example, the dielectric may be made of a ceramic material, a glass, a silicone-based material, or a polymer-based material. Further, the dielectric may be air. The dielectric is, for example, an electrically at least partially insulating material.

Figure 4:
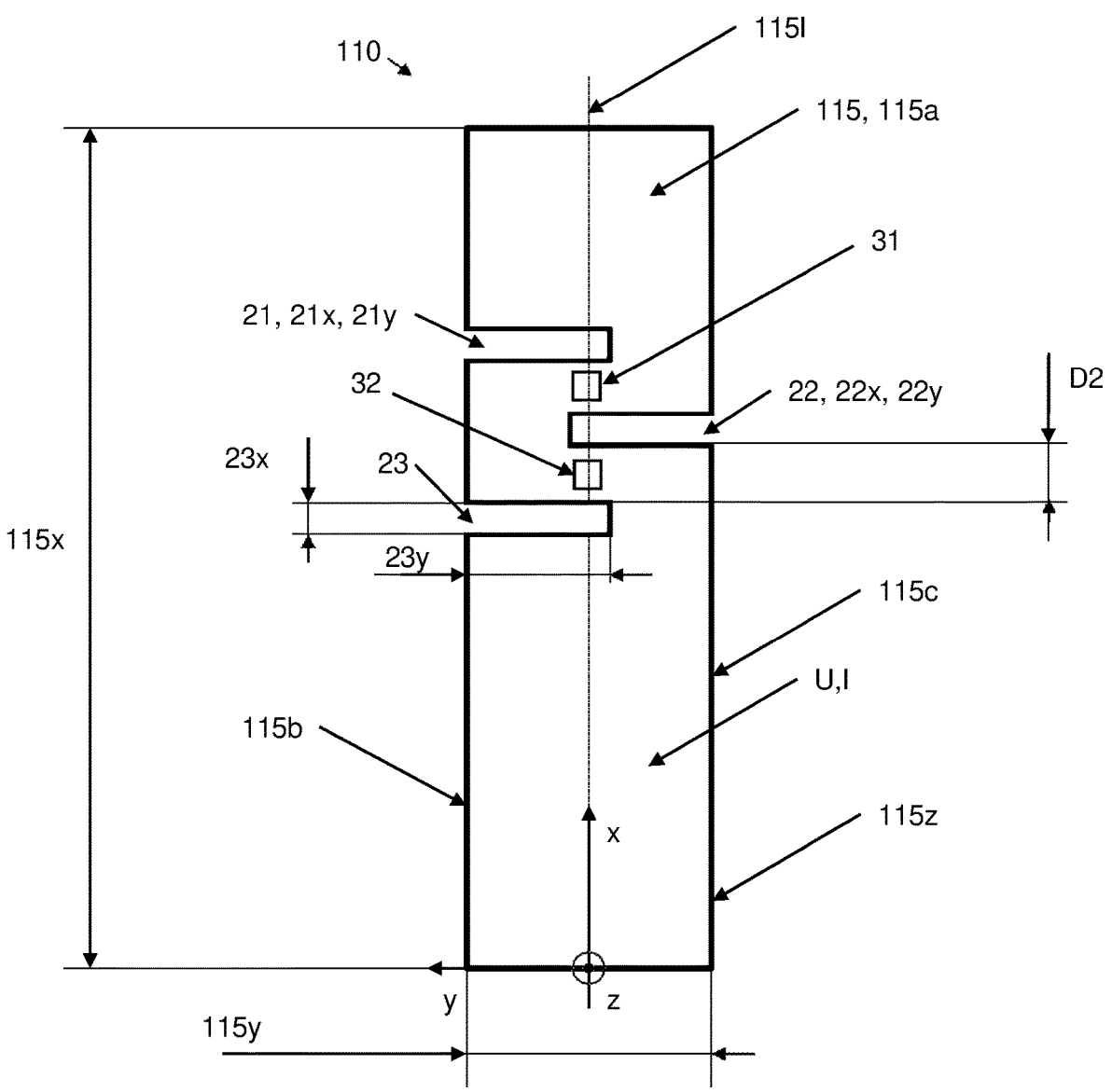
FIG. 4 shows an overview of a second aspect of a sensor device.

FIG. 4 shows an overview of a second aspect of a sensor device 110. The sensor device 110 of the second aspect comprises substantially the components of the first aspect of the sensor device 10. Given the similarity between the first and second aspects, the components of the second aspect that have the same function and/or structure as the components of the first aspect will not be explained or described again for brevity.

The sensor device 110 of the second aspect has a busbar 115, the first magnetic field sensor 31, and a second magnetic field sensor 32. The busbar 115 has a busbar longitudinal axis 1151, a busbar length 115*x*, a busbar width 115*y*, a first busbar surface 115*a*, a second busbar surface 115*b*, and a third busbar surface 115*c*. The busbar longitudinal axis 1151 is the central axis of the busbar 115 corresponding to an axis of the largest spatial extent of the busbar 115. The busbar longitudinal axis 1151 extends parallel to the x-direction. The busbar length 115*x* corresponds to a spatial extent of the busbar 115 in the x-direction. The busbar width 115*y* corresponds to a spatial extension of the busbar 115 in the y-direction. The busbar thickness 115*z* corresponds to a spatial extent of the busbar 115 in the z-direction.

The first busbar surface 115*a* corresponds to the surface comprising a largest surface area of the busbar 115 and being arranged in the positive z-direction. The second busbar surface 115*b* corresponds to the surface that is substantially orthogonal to the first busbar surface 115*a* and is arranged in the positive y-direction. The second busbar surface 115*b* extends substantially parallel to the busbar longitudinal axis 1151. The third busbar surface 115*c* corresponds to the surface arranged substantially orthogonal to the first busbar surface 115*a*. The third busbar surface 115*c* extends substantially parallel to the busbar longitudinal axis 1151.

The busbar 115 has at least a first recess 21, a second recess 22, and a third recess 23. The first recess 21 has a first recess length 21*y* and a first recess width 21*x*. The second recess 22 has the second recess length 22*y* and the second recess width 22*x*. The third recess 23 has a third recess length 23*y* and a third recess width 23*x*. The first recess 21, the second recess 22, and the third recess 23 extend substantially orthogonal to the busbar longitudinal axis 1151. The first recess 21, the second recess 22, and the third recess 23 are substantially parallel to each other. A sum of the first recess length 21*y* and the second recess length 22*y* is greater than the busbar width 115*y*. A sum of the first recess length 21*y* and the third recess length 23*y* is greater than the busbar width 115*y*. A sum of the second recess length 22*y* and the third recess length 23*y* is greater than the busbar width 115*y*. Due to the location of the recesses 21, 22, 23, the busbar 115 is also referred to as a "double S-shaped notched busbar".

The first recess 21, the second recess 22 and the third recess 23 extend substantially orthogonal to the busbar longitudinal axis 1151. The second recess 22 and the third recess 23 are spaced apart from each other along the busbar longitudinal axis 1151 by a distance D2.

Figure 5:
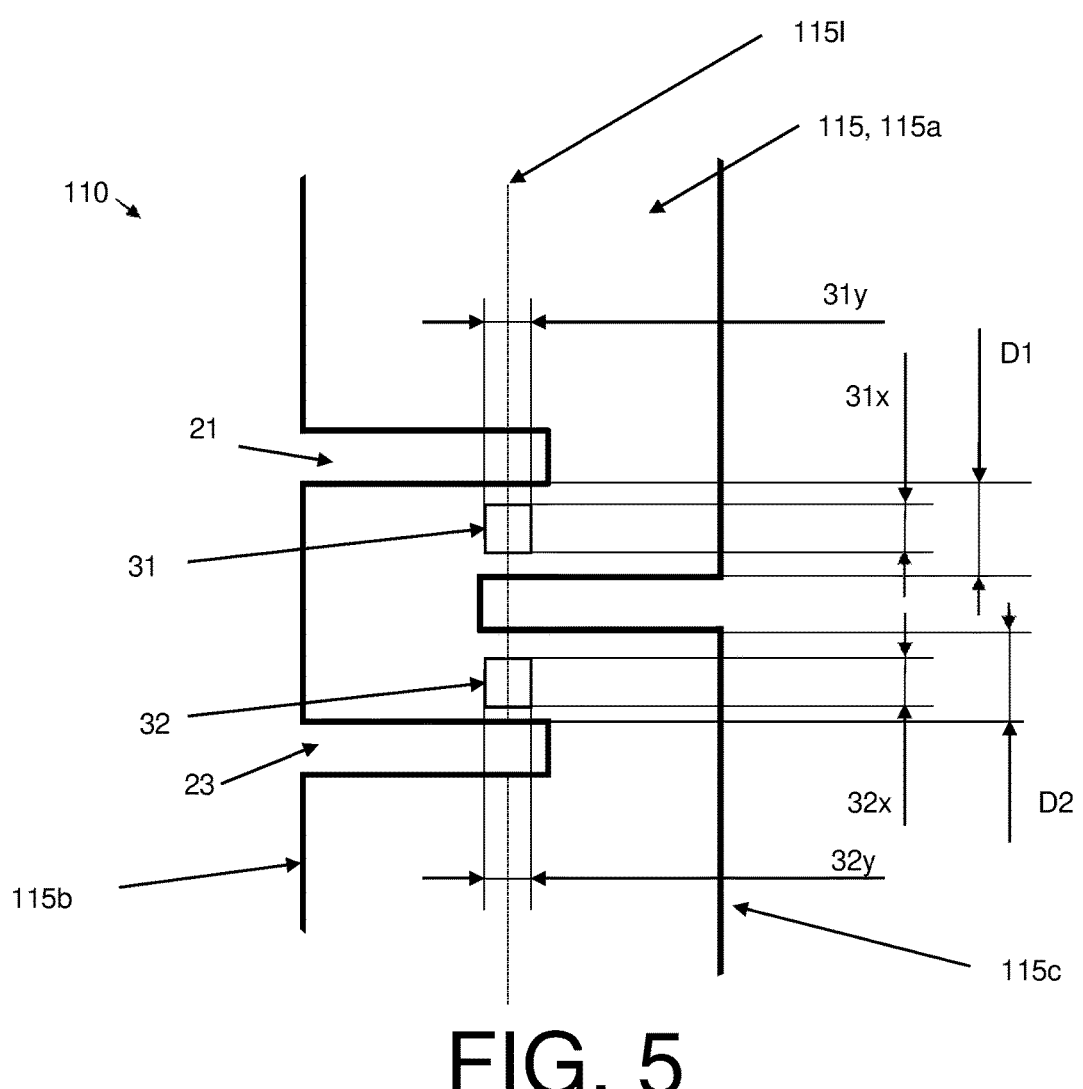
FIG. 5 shows an enlarged section of the first aspect of the sensor device shown in FIG. 4.

FIG. 5 shows an enlarged section of the second aspect of the sensor device 110 shown in FIG. 4. The first magnetic field sensor 31 has a first magnetic field sensor length 31*x* and a first magnetic field sensor width 31*y*. The first magnetic field sensor 31 is arranged on the first busbar surface 15a between the first recess 21 and the second recess 22 using an/the entire surface of the first magnetic field sensor 31 facing the first busbar surface 15a. The second magnetic field sensor 32 has a second magnetic field sensor length 32x and a second magnetic field sensor width 32y. The second magnetic field sensor 32 comprises, for example, a Hall sensor element (vertical or horizontal), a magnetoresistive sensor element, or a fluxgate sensor element. The sensor element may be a vertically (Bz) or laterally (By) measuring sensor element. For example, a magnetoresistive sensor element such as AMR, GMR and/or TMR, a fluxgate sensor element or a Weigand sensor element can act as a laterally measuring sensor element. For redundancy reasons, the sensor element may also comprise a plurality of sensor elements. The second magnetic field sensor 32 is arranged on the first busbar surface 15a between the second recess 22 and the third recess 23 using an/the entire surface of the second magnetic field sensor 32 facing the first busbar surface 15a.

The first magnetic field sensor 31 is preferably arranged between the first recess 21 and the second recess 22 in the second aspect of the sensor device 110. The second magnetic field sensor 32 is preferably arranged between the second recess 22 and the third recess 23 in the second aspect of the sensor device 110. Preferably, a sum of the first recess length 21y, the second recess length 22y and the first magnetic field sensor width 31y is equal to or greater than the busbar width 115y. Preferably, a sum of the second recess length 22y, the third recess length 23y, and the second magnetic field sensor width 32y is equal to or greater than the busbar width 115y. For example, a ratio of the first recess length 21y, the second recess length 22y, the busbar width 115y, the first magnetic field sensor width 31y, and the distance D1 may be as described in the following equations.

for $31y << D1$ it is valid: $21y + 22y - D1 = 115y$ for $31y \geq D1$ it is valid: $21y + 22y - 31y = 115y$ Voltage U is applied to the busbar 115. The busbar 115 has a cross section 115Q. The cross-section 115Q of the busbar 115 is substantially constant along the busbar 115. In the region of the first recess 21, the second recess 22 and the third recess 23 and in the region between the first recess 21 and the second recess 22 and in the region between the second recess 22 and the third recess 23, the cross-section 115Q of the busbar 15 is reduced by the first recess 21, the second recess 22 and the third recess 23.

This reduction in the cross section 115Q of the busbar 115 is a local reduction in the cross-sectional area 115Q relative to an initial cross section 115Q of the busbar 115 in the region away from the first recess 21, the second recess 22, and the third recess 23. The narrowing/tapering of the busbar 115 in the region of the first recess 21, the second recess 22, and the third recess 23, and in the region between the first recess 21 and the second recess 22, and in the region between the second recess 22 and the third recess 23, locally produces an increased current density J. The current density J is defined as the quotient of the current intensity I and the cross-sectional area 115Q at a respective position of the busbar 115.

In the region of the increased current density J, the magnetic field strength of the magnetic field B is increased. The first magnetic field sensor 31 and the second magnetic field sensor are arranged in the region of the increased magnetic field strength in the second aspect of the sensor device 110. Preferably, the first magnetic field sensor 31 is arranged centrally between the first recess 21 and the second recess 22, when viewed along the x-axis. Preferably, the second magnetic field sensor 32 is arranged centrally between the second recess 22 and the third recess 23, when viewed along the x-axis. Preferably, the first magnetic field sensor 31 is arranged centrally in the region between an end of the first recess 21 projecting into the busbar 115 and an end of the second recess 22 projecting into the busbar 115, when viewed along the y-axis.

Preferably, the second magnetic field sensor 32 is arranged centrally in the region between the end of the second recess 22 projecting into the busbar 115 and an end of the third recess 23 projecting into the busbar 115, when viewed along the y-axis. This arrangement of the first magnetic field sensor 31 and the second magnetic field sensor 32 further increases an accuracy of a measurement of the magnetic field strength of the magnetic field B. If the sensor device 110 of the second aspect comprises the first magnetic field sensor 31 and the second magnetic field sensor 32, the accuracy of a measurement of the magnetic field strength of the magnetic field B is further increased using a differential measurement of the magnetic field strength. Moreover, if one of the first magnetic field sensor 31 or the second magnetic field sensor 32 fails or malfunctions, measurement of the magnetic field strength of the magnetic field B can still be performed. Furthermore, the differential measurement can reduce an influence from the extraneous fields on the measurement result. This redundant arrangement may contribute to the safety of the sensor device 110, for example.

Figure 6:
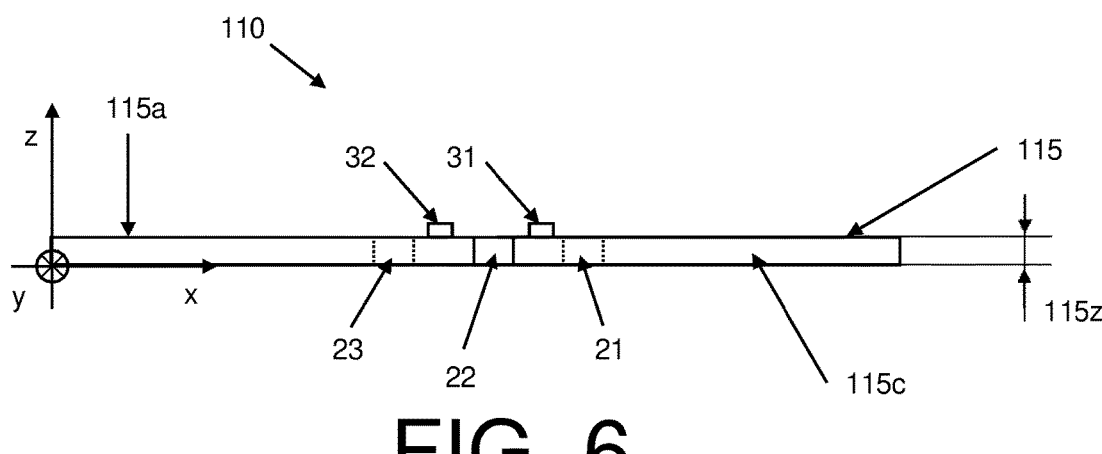
FIG. 6 shows a side view of the second aspect of the sensor device shown in FIG. 4 and FIG. 5.

FIG. 6 shows a side view of the second aspect of the sensor device 110 shown in FIG. 4 and FIG. 5. The first magnetic field sensor 31 is arranged on the first busbar surface 115a between the first recess 21 and the second recess 22 using an/the entire surface of the first magnetic field sensor 31 facing the first busbar surface 115a. The second magnetic field sensor 32 is arranged on the first busbar surface 115a between the second recess 22 and the third recess 23 using an/the entire surface of the second magnetic field sensor 32 facing the first busbar surface 115a. The surface of the first magnetic field sensor 32 facing the first busbar surface 115a may be in direct contact with the first busbar surface 115a. The surface of the first magnetic field sensor 31 facing the first busbar surface 115a may also be in contact with the first busbar surface 115a using a first additional element (not shown). The surface of the second magnetic field sensor 32 facing the first busbar surface 115a may be in direct contact with the first busbar surface 115a. The surface of the second magnetic field sensor 32 facing the first busbar surface 115a may also be in contact with the first busbar surface 115a using a second additional element (not shown). The first additional element and the second additional element comprise, for example, a dielectric. For example, the dielectric may be made of a ceramic material, a glass, a silicone-based material, or a polymer-based material. Further, the dielectric may be air. The dielectric is, for example, an electrically at least partially insulating material.

Figure 7:
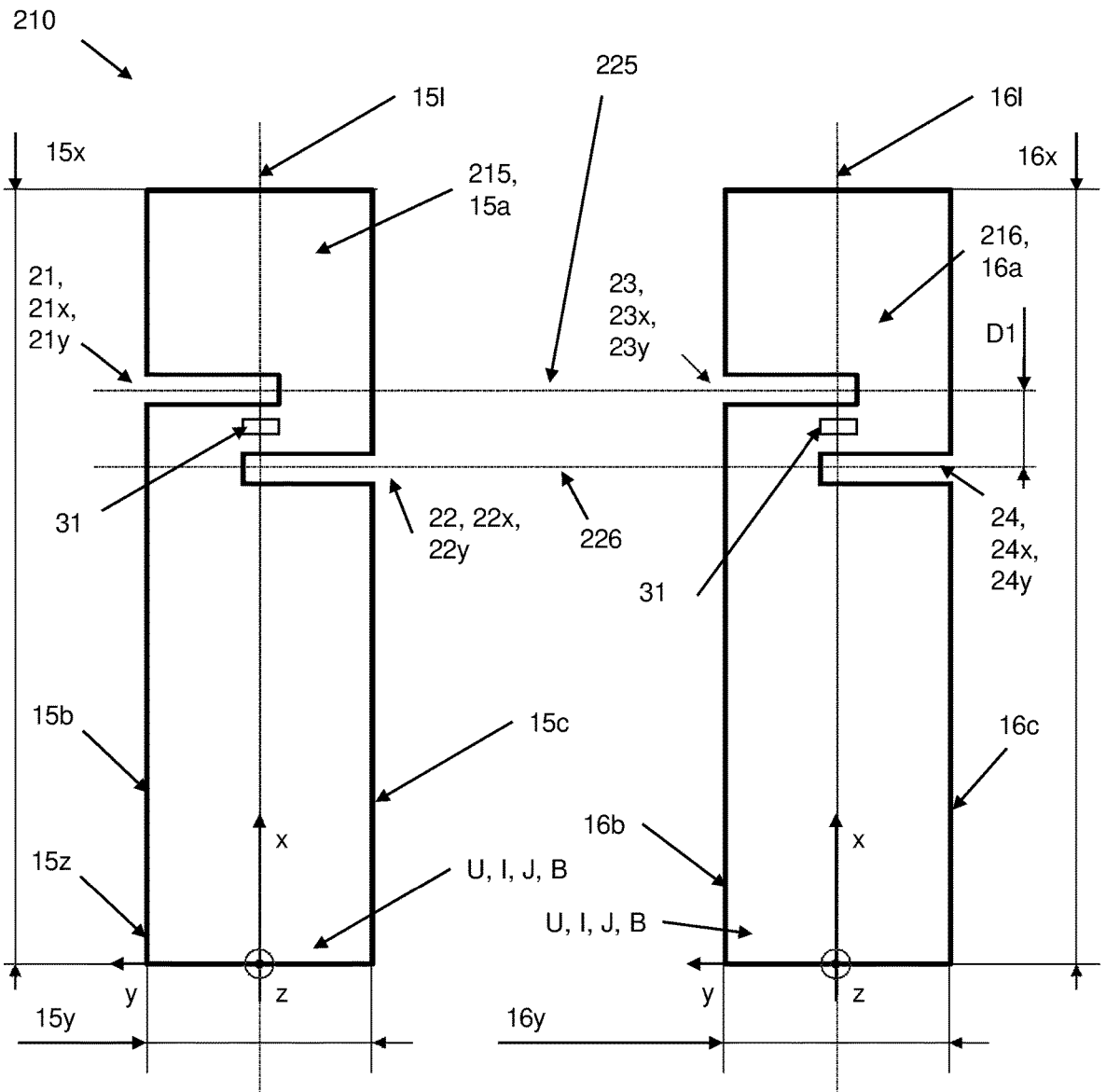
FIG. 7 shows a first aspect of a sensor arrangement for determining an electrically induced magnetic field in a first busbar and/or a second busbar.

FIG. 7 illustrates a first aspect of a sensor arrangement 210 for determining an electrically induced magnetic field in a first busbar 215 and/or a second busbar 216. The first aspect of the sensor arrangement 210 comprises the first busbar 215 and the second busbar 216. The first busbar 215 and the second busbar 216 substantially correspond to the busbar 15 of the first aspect of the sensor device 10. The first busbar 215 and the second busbar 216 substantially have the features of the busbar 15 of the first aspect of the sensor device 10.

The objective of the sensor arrangement 210 is to determine the electrically induced magnetic field in the first busbar 215 and/or the second busbar 216 while reducing an electromagnetic interaction between that of the first busbar 215 and the second busbar 216. When the busbars 215, 216 are arranged side by side, a so-called "crosstalk" (also referred to as "side talk") can occur. This crosstalk is understood to be an undesired mutual interference of independent electrical elements or components. When measuring the electrically induced magnetic field in the first busbar 215, interference can occur from the electrically induced magnetic field of the second busbar 216. Similarly, when measuring the electrically induced magnetic field in the second busbar 216, interference may occur from the electrically induced magnetic field of the first busbar 215. This crosstalk between the electrically induced magnetic field of the first busbar 215 and the second busbar 216 is reduced or largely prevented by the preferred arrangement of the proposed aspect.

For example, the first busbar 215 and the second busbar 216 have a busbar longitudinal axis 151, 161, a busbar length 15x, 16x, a busbar width 15y, 16y, a first busbar surface 15a, 16a, a second busbar surface 15b, 16b, and a third busbar surface 15c, 16c. The busbar longitudinal axis 151, 161 is the central axis of the busbar 215, 216 corresponding to an axis of the largest spatial extent of the busbar 215, 216. The busbar longitudinal axis 151, 161 also extends parallel to the x-direction. The busbar length 15x, 16x corresponds to a spatial extension of the busbar 215, 216 in the x-direction. The busbar width 15y, 16y corresponds to a spatial extension of the busbar 215, 216 in the y-direction. The busbar thickness 15z, 16z corresponds to a spatial extent of the busbar 215, 216 in the z-direction.

The first busbar 215 and the second busbar 216 are identical in a first configuration of the first aspect of the sensor arrangement 210. Of course, the first busbar 215 and the second busbar 216 may be different in a further configuration of the first aspect of the sensor arrangement 210. For example, the first busbar 215 and the second busbar 216 may have different busbar widths 15y, 16y. For example, the first busbar 215 and the second busbar 216 may further comprise different materials.

The first busbar 215 has at least the first recess 21 and the second recess 22. The second busbar 216 has at least a third recess 23 and a fourth recess 24. The first recess 21 and the third recess 23 are identical in the first configuration. The second recess 22 and the fourth recess 24 are identical in the first configuration. Of course, the first recess 21, the second recess 22, the third recess 23, and the fourth recess 24 may also be different in a further configuration of the first aspect of the sensor arrangement 210. For example, the recess lengths 21y, 22y, 23y, 24y may be different. For example, the recess widths 21x, 22x, 23x, 24x may be different.

The first recess 21 and the second recess 22 extend substantially orthogonal to the busbar longitudinal axis 151. The third recess 23 and the fourth recess 24 extend substantially orthogonal to the busbar longitudinal axis 161. The first recess 21 and the second recess 22 are substantially parallel to each other. The third recess 23 and the fourth recess 24 are substantially parallel to each other. A sum of the first recess length 21y and the second recess length 22y is greater than a busbar width 15y of the first busbar 215, and a sum of the third recess length 23y and the fourth recess length 24y is greater than a busbar width 16y of the second busbar 216.

The first recess 21 extends substantially parallel to the second recess 22. The third recess 23 extends substantially parallel to the fourth recess 24. The first recess 21, the second recess 22, the third recess 23, and the fourth recess 24 extend substantially parallel to each other. The first recess 21 and the third recess 23 are arranged along a first axis 225. The second recess 22 and the fourth recess 24 are arranged along a second axis 226.

The first recess 21 and the second recess 22 are spaced apart from each other along the busbar longitudinal axis 151 of the first busbar 215 by a distance D1. The third recess 23 and the fourth recess 24 are spaced apart from each other along the busbar longitudinal axis 161 of the second busbar 216 by a distance D1. The first axis 225 is orthogonal to the busbar longitudinal axis 151, 161 and extends in the y-direction. The second axis 226 is orthogonal to the busbar longitudinal axis 151, 161 and extends in the y-direction. The first axis 225 is parallel to the second axis 226. The first axis 225 is different from the second axis 226. The first axis 225 is spaced apart from the second axis 226 by a distance D1, when viewed along the x-axis.

By arranging the first recess 21 and the third recess 23 along the first axis 225 and the second recess 22 and the fourth recess 24 along the second axis 226, crosstalk between the first busbar 215 and the second busbar 216 is reduced.

In a first configuration, the sensor arrangement 210 has a first magnetic field sensor 31 arranged on one of the busbar surface 15a or the busbar surface 16a. In this first configuration, the first magnetic field sensor 31 is arranged on the first busbar surface 15a of the first busbar 215 using an/the entire surface of the first magnetic field sensor 31 facing the busbar surface 15a. Alternatively, in this first configuration, the first magnetic field sensor 31 may be arranged on the first busbar surface 15a of the second busbar 216 using an/the entire surface of the first magnetic field sensor 31 facing the busbar surface 15a.

In a second configuration, the sensor arrangement 210 comprises the first magnetic field sensor 31 and a second magnetic field sensor 32. The second magnetic field sensor 32 is substantially the same as the first magnetic field sensor 31 of the first configuration. In this second configuration, the first magnetic field sensor 31 is arranged on the first busbar 21 and the second magnetic field sensor 31 is arranged on the second busbar 22. By using the magnetic field sensors 31, 32, it is possible to determine the strength of the electrically induced magnetic field in the first busbar 215 and in the second busbar 216. This enables accurate measurement of the magnetic field strength of the electrically induced magnetic field B. The determined magnetic field strength can be used, for example, to draw conclusions about a current I flowing in the first busbar 215 and/or a current I flowing in the second busbar 216.

Figure 8:
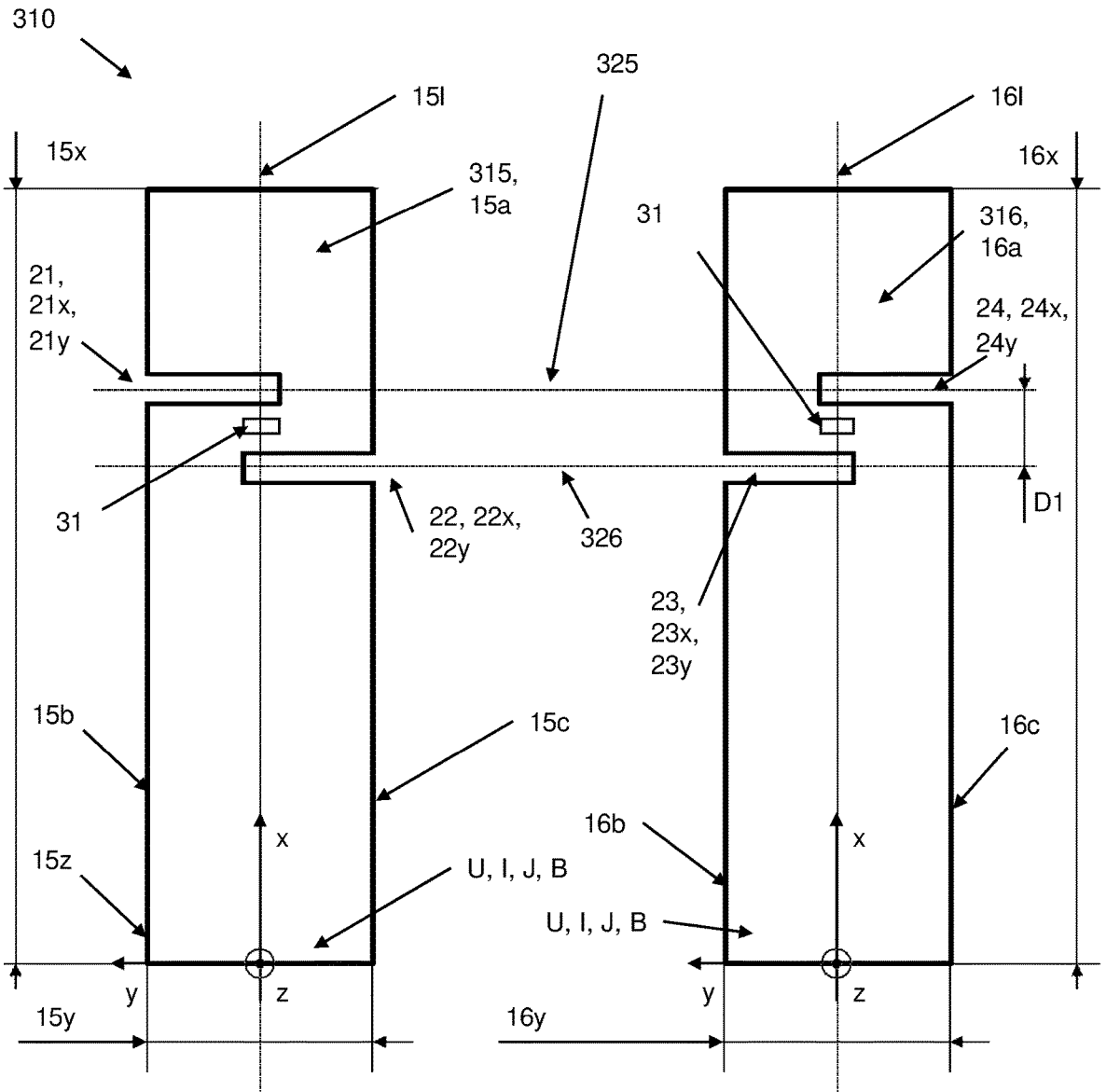
FIG. 8 shows a second aspect of a sensor arrangement for determining an electrically induced magnetic field in a first busbar and/or a second busbar.

FIG. 8 shows a second aspect of a sensor arrangement 310 for determining an electrically induced magnetic field in a first busbar 315 and/or a second busbar 316. The first busbar 315 is substantially the same as the first busbar 215 of the first aspect. The second busbar 316 is substantially the same as the second busbar 216 of the first aspect. However, in the present aspect, the third recess 23 and the fourth recess 24 are arranged mirrored about the x-axis. This mirrored arrangement of the third recess 23 and the fourth recess 24 rotates an orientation of the electromagnetically induced magnetic field by 180° (180 degrees) with respect to the z-axis. This reduces the crosstalk between the first busbar 315 and the second busbar 316.

Figure 9:
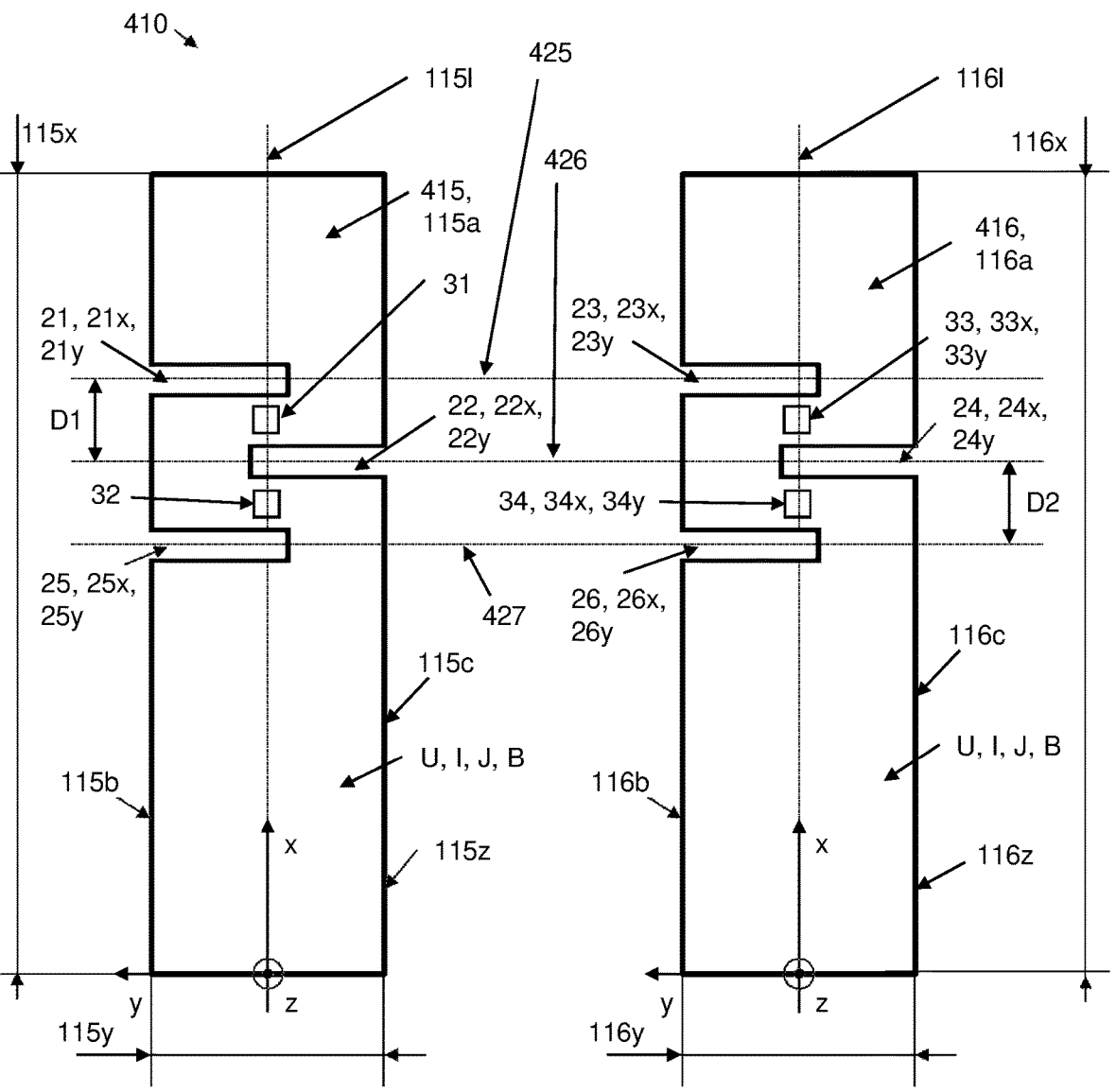
FIG. 9 shows a third aspect of a sensor arrangement for determining an electrically induced magnetic field in a first busbar and/or a second busbar.

FIG. 9 illustrates a third aspect of a sensor arrangement 410 for determining an electrically induced magnetic field in a first busbar 415 and/or a second busbar 416. The third aspect of the sensor arrangement 410 has the first busbar 415 and the second busbar 416. The first busbar 415 and the second busbar 416 substantially correspond to the busbar 115 of the second aspect of the sensor device 110. The first busbar 415 and the second busbar 416 have substantially the same features as the busbar 115 of the second aspect of the sensor device 110. Given the similarity between the second and third aspects, the components of the third aspect that have the same function and/or structure as the components of the second aspect will not be explained or described again for the sake of brevity.

The aim of the sensor arrangement 410 is to determine the electrically induced magnetic field in the first busbar 415 and/or the second busbar 416 while reducing an electromagnetic interaction between the first busbar 415 and the second busbar 416, and at the same time to further increase a measurement accuracy and redundancy. For this purpose, the crosstalk between the electrically induced magnetic field of the first busbar 415 and the second busbar 416 is reduced or largely prevented by the preferred arrangement of the proposed aspect.

For example, the first busbar 415 and the second busbar 416 have busbar longitudinal axis 1151, 1161, busbar length 115*x*, 116*x*, busbar width 115*y*, 116*y*, first busbar surface 115*a*, 116*a*, second busbar surface 115*b*, 116*b*, and third busbar surface 115*c*, 116*c*.

The first busbar 415 and the second busbar 416 are identical in a first configuration of the third aspect of the sensor arrangement 410. Of course, the first busbar 415 and the second busbar 416 may be different in a further configuration of the first aspect of the sensor arrangement 410. For example, the first busbar 415 and the second busbar 416 may have different busbar widths 115*y*, 116*y*. For example, the first busbar 415 and the second busbar 416 may further comprise different materials.

The first busbar 415 has the first recess 21, the second recess 22, and the fifth recess 25. The second busbar 416 has the third recess 23, the fourth recess 24, and a sixth recess 26. The first recess 21, the second recess 22, the third recess 23, the fourth recess 24, the fifth recess 25, and the sixth recess 26 are identical in the first configuration of the third aspect. Of course, the first recess 21, the second recess 22, the third recess 23, the fourth recess 24, the fifth recess 25, and the sixth recess 26 may also be different in a further configuration of the third aspect of the sensor arrangement 210. For example, the recess lengths 21*y*, 22*y*, 23*y*, 24*y*, 25*y*, 26*y* may be different. For example, the recess widths 21*x*, 22*x*, 23*x*, 24*x*, 25*x*, 26*x* may be different.

The first recess 21, the second recess 22, and the fifth recess 25 extend substantially orthogonal to the busbar longitudinal axis 151. The third recess 23, the fourth recess 24, and the sixth recess 26 extend substantially orthogonal to the busbar longitudinal axis 161. The first recess 21 and the second recess 22 are substantially parallel to each other. The third recess 23 and the fourth recess 24 are substantially parallel to each other. The fifth recess 25 and the sixth recess 26 are substantially parallel to each other. A sum of the first recess length 21*y* and the second recess length 22*y* is greater than the busbar width 115*y* of the first busbar 415. A sum of the second recess length 22*y* and the fifth recess length 25*y* is greater than the busbar width 115*y* of the first busbar 415. A sum of the third recess length 23*y* and the fourth recess length 24*y* is greater than the busbar width 116*y* of the second busbar 416. A sum of the fourth recess length 24*y* and the sixth recess length 26*y* is greater than the busbar width 116*y* of the second busbar 416.

The first recess 21 extends substantially parallel to the second recess 22. The third recess 23 extends substantially parallel to the fourth recess 24. The fifth recess 25 extends substantially parallel to the sixth recess 26. The first recess 21, the second recess 22, the third recess 23, the fourth recess 24, the fifth recess 25, and the sixth recess 26 extend substantially parallel to each other. The first recess 21 and the third recess 23 are arranged along a first axis 225. The second recess 22 and the fourth recess 24 are arranged along a second axis 226.

The first recess 21 and the second recess 22 are spaced apart from each other along the busbar longitudinal axis 151 of the busbar 415 by a distance D1. The third recess 23 and the fourth recess 24 are spaced apart from each other along the busbar longitudinal axis 161 of the second busbar 416 by a distance D1. The second recess 22 and the fifth recess 25 are spaced apart from each other along the busbar longitudinal axis 151 of the busbar 415 by a distance D2. The fourth recess 24 and the sixth recess 26 are spaced apart from each other along the busbar longitudinal axis 161 of the second busbar 416 by a distance D2. The first axis 425 is orthogonal to the busbar longitudinal axis 151, 161 and extends in the y-direction. The second axis 426 is orthogonal to the busbar longitudinal axis 151, 161 and extends in the y-direction. The third axis 427 is orthogonal to the busbar longitudinal axis 151, 161 and extends in the y-direction. The first axis 425, the second axis 426 and the third axis 427 are parallel to each other. The first axis 425, the second axis 426, and the third axis 427 are different from each other.

By arranging the first recess 21 and the third recess 23 along the first axis 425, arranging the second recess 22 and the fourth recess 24 along the second axis 426, and arranging the fifth recess 25 and the sixth recess 26 along the third axis 427, crosstalk between the first busbar 415 and the second busbar 416 is reduced.

In a first configuration, the sensor arrangement 410 comprises the first magnetic field sensor 31 and a third magnetic field sensor 33. In this first configuration, the sensor arrangement 410 comprises the first magnetic field sensor 31 arranged on the first busbar surface 15*a* of the first busbar 415 and the third sensor 23 arranged on the first busbar surface 16*a* of the second busbar 416. In this first configuration, the first magnetic field sensor 31 is on the busbar surface 15*a* of the first busbar 415 using an/the entire surface of the third magnetic field sensor 33 facing the busbar surface 15*a*, and the third magnetic field sensor 33 is arranged on the busbar surface 16*a* of the second busbar 416 using an/the entire surface of the third magnetic field sensor 33 facing the busbar surface 16*a*. The arrangement of the magnetic field sensors 31, 33 enables measurement of the magnetic field strength in the first busbar 415 and the second busbar 416.

In a second configuration, the sensor arrangement 410 comprises the first magnetic field sensor 31, the second magnetic field sensor 32, and one of the third magnetic field sensor 33 or a fourth magnetic field sensor 34. In this second configuration, the sensor arrangement 410 comprises the first magnetic field sensor 31 arranged on the first busbar surface 15*a* of the first busbar 415 and the third sensor 23 arranged on the first busbar surface 16*a* of the second busbar 416. In this second configuration, the first magnetic field sensor 31 is arranged on the busbar surface 15*a* of the first busbar 415 using an/the entire surface of the second magnetic field sensor 32 facing the busbar surface 15*a*, and the third magnetic field sensor 33 is arranged on the busbar surface 16*a* of the second busbar 416 using an/the entire surface of the third magnetic field sensor 33 facing the busbar surface 16*a*.

In the second configuration, the sensor arrangement 410 further comprises the second magnetic field sensor 32 arranged on the first busbar surface 15*a* of the first busbar 415 or the fourth magnetic field sensor 34 arranged on the first busbar surface 16*a* of the second busbar 416. If the sensor arrangement 410 comprises the second magnetic field sensor 32, the second magnetic field sensor 32 is arranged on the first busbar surface 15*a* of the first busbar 415 using an/the entire surface of the second magnetic field sensor 32 facing the first busbar surface 15*a*. If the sensor arrangement 410 has the fourth magnetic field sensor 34, the fourth magnetic field sensor 34 is arranged on the first busbar surface 16*a* of the first busbar 416 using an/the entire surface of the fourth magnetic field sensor 34 facing the first busbar surface 15*a*.

By using the first magnetic field sensor 31, the second magnetic field sensor 32, and one of the third magnetic field sensor 33 or the fourth magnetic field sensor 34, it is possible to determine the strength of the electrically induced magnetic field B in the first busbar 415 and in the second busbar 416. In addition, by using the magnetic field sensors 31, 32, 33, 34, it is possible to perform a differential measurement of the magnetic field strength in the first busbar 415 or in the second busbar 416. This enables an accurate measurement of the magnetic field strength of the electrically induced magnetic field B. Using the determined magnetic field strength, conclusions can be drawn, for example, about a current I flowing in the first busbar 415 and/or a current I flowing in the second busbar 416.

In a third configuration, the sensor arrangement 410 comprises the first magnetic field sensor 31, the second magnetic field sensor 32, the third magnetic field sensor 33, and the fourth magnetic field sensor 34. In this third configuration, the sensor arrangement 410 comprises the first magnetic field sensor 31 arranged on the first busbar surface 15*a* of the first busbar 415 and the second magnetic field sensor 32 arranged on the first busbar surface 15*a* of the first busbar 415. In this third configuration, the sensor arrangement 410 further comprises the third sensor 23 arranged on the first busbar surface 16*a* of the second busbar 416 and the sensor 34 arranged on the first busbar surface 16*a* of the second busbar 416. In this third configuration, the first magnetic field sensor 31 and the second magnetic field sensor 32 are arranged on the busbar surface 15*a* of the first busbar 415 using an/the entire surface of the first magnetic field sensor 31 and the second magnetic field sensor 32 facing the busbar surface 15*a*. In this third configuration, the third magnetic field sensor 33 and the fourth magnetic field sensor 34 are also arranged on the busbar surface 16*a* of the second busbar 416 using an/the entire surface of the third magnetic field sensor 33 and the fourth magnetic field sensor 34 facing the busbar surface 16*a*.

By using the magnetic field sensors 31, 32, 33, 34, it is possible to determine the strength of the electrically induced magnetic field in the first busbar 415 and in the second busbar 416. In addition, by using the magnetic field sensors 31, 32, 33, 34, it is possible to perform a differential measurement of the magnetic field strength in the first busbar 415 and in the second busbar 416. This enables accurate measurement of the magnetic field strength of the electrically induced magnetic field. Using the determined magnetic field strength, conclusions can be drawn, for example, about a current I flowing in the first busbar 415 and/or a current I flowing in the second busbar 416.

Figure 10:
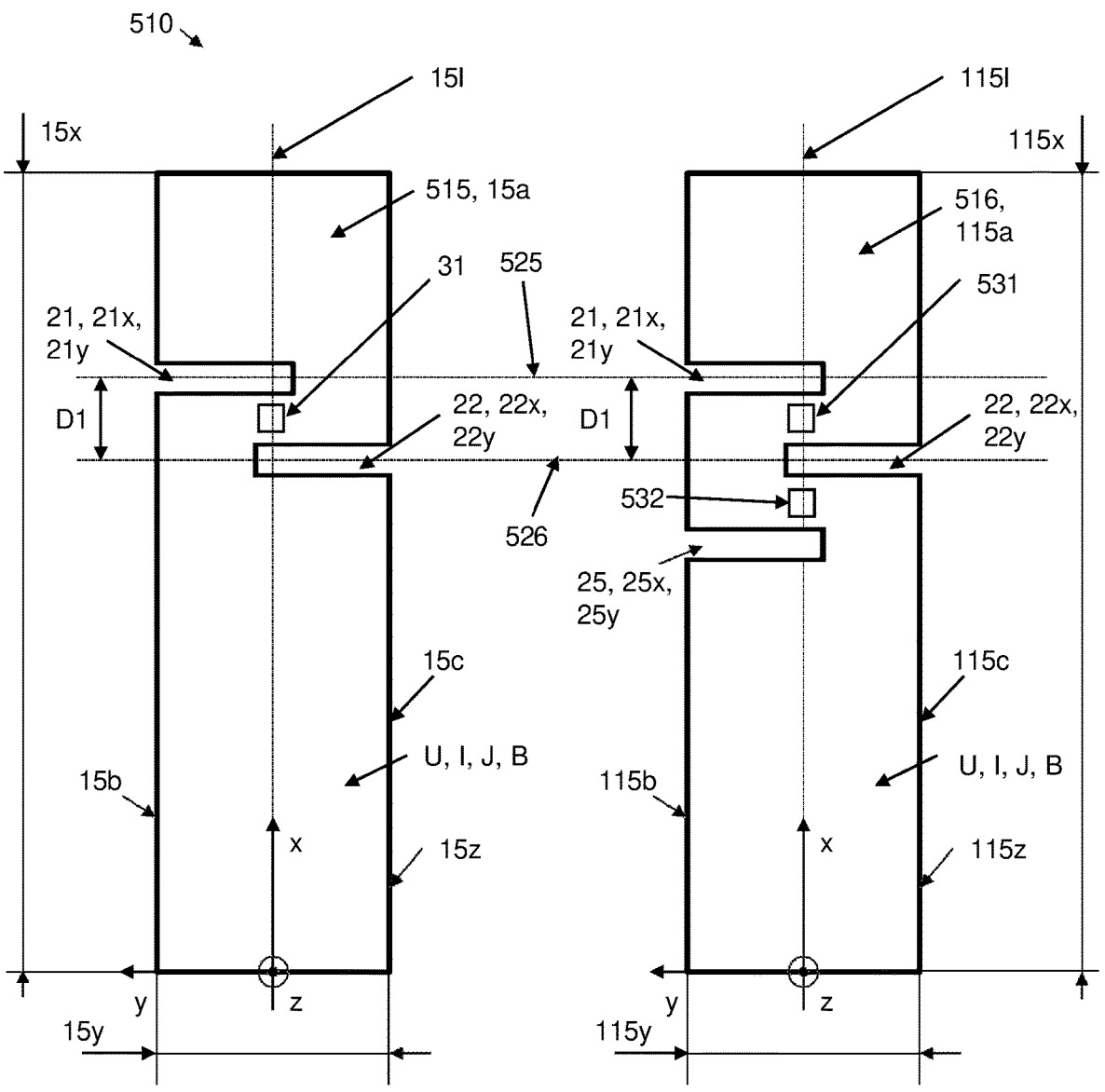
FIG. 10 shows a fourth aspect of a sensor arrangement for determining an electrically induced magnetic field in a first busbar and a second busbar.

FIG. 10 shows a fourth aspect of a sensor arrangement 510 for determining an electrically induced magnetic field in a first busbar 515 and a second busbar 516. The fourth aspect of the sensor arrangement 510 comprises the first busbar 515 and the second busbar 516. The first busbar 515 substantially corresponds to the busbar 15 of the first aspect of the sensor device 10. The first busbar 515 substantially has the features of the busbar of the first aspect of the sensor device 10. The second busbar 516 is substantially the same as the busbar 115 of the second aspect of the sensor device 110. The second busbar 516 has substantially the same features as the busbar 115 of the second aspect of the sensor device 110. Given the similarity between the first and fifth aspects and the second and fourth aspects, the components of the first aspect and the second aspect that have the same function and/or structure as the components of the fourth aspect will not be explained or described again for the sake of brevity.

On the first busbar 515, the first magnetic field sensor 31 is arranged. A first magnetic field sensor 531 and a second magnetic field sensor 532 are arranged on the second busbar 516. The magnetic field sensors 31, 531, 532 are substantially identical. Of course, in a further configuration of the fifth aspect of the sensor arrangement 510, the magnetic field sensors 31, 531, 532 can also be different.

By using the magnetic field sensors 31, 531, 532 it is possible to determine the strength of the electrically induced magnetic field B in the first busbar 515 and in the second busbar 516. In addition, by using the magnetic field sensors 531, 532, it is possible to perform a differential measurement of the magnetic field strength in the second busbar 516. This enables an accurate measurement of the magnetic field strength of the electrically induced magnetic field B. Using the determined magnetic field strength, conclusions can be drawn, for example, about a current I flowing in the first busbar 515 and/or a current I flowing in the second busbar 516.

Figure 11:
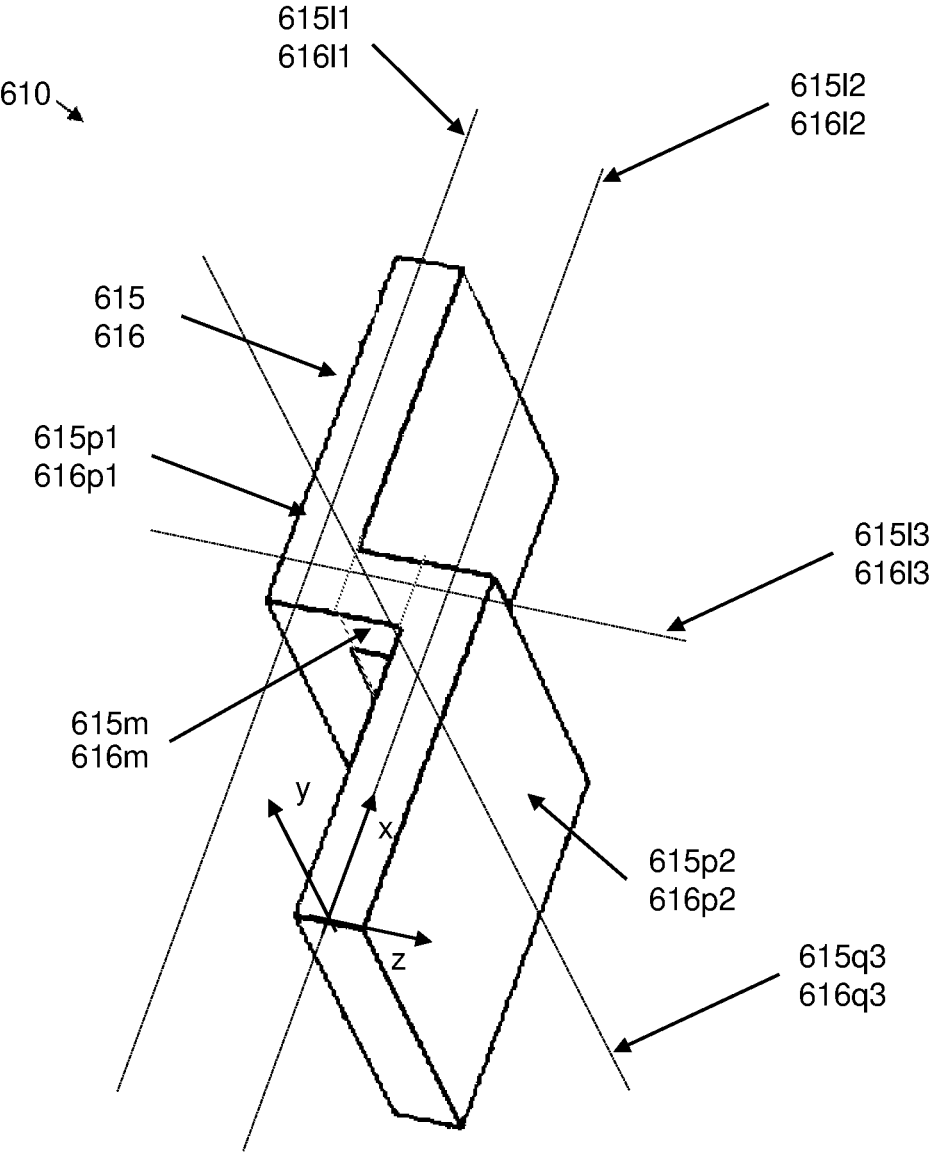
FIG. 11 shows a third aspect of a sensor device.

FIG. 11 shows a third aspect of a sensor device 610 for determining an electrically induced magnetic field. The sensor device 610 is substantially the same as the sensor devices 10, 110 of the first to second aspects. However, the sensor device 610 is angled. The sensor device 610 of the third aspect has a busbar 615, 616. The busbar 615, 616 has a first busbar section 615*p*1, 616*p*1, a second busbar section 615*p*2, 616*p*2, and a busbar intermediate section 615*m*, 616*m*. The busbar intermediate section 615*m*, 616*m* is arranged between the first busbar section 615*p*1, 616*p*1 and the second busbar section 615*p*2, 616*p*2. The busbar 615, 616 comprising the first busbar section 615*p*1, 616*p*1, the second busbar section 615*p*2, 616*p*2 and the busbar intermediate section 615*m*, 616*m* can be formed integrally or in multiple parts. Preferably, the busbar 615, 616 is integrally formed.

In the sensor device 610, the first busbar section 615*p*1, 616*p*1 has a first busbar longitudinal axis 61511, 61611. In the sensor device 610, the second busbar section 615*p*2, 616*p*2 has a second busbar longitudinal axis 61512, 61612. The first busbar longitudinal axis 61511, 61611 and the second busbar longitudinal axis 61512, 61612 are substantially parallel to each other.

The busbar intermediate section 615*m*, 616*m* has a busbar intermediate section longitudinal axis 61513, 61613 and a busbar intermediate section transverse axis 615*q*3, 616*q*3. The busbar intermediate section longitudinal axis 61513, 61613 is substantially orthogonal to the first busbar longitudinal axis 61511, 61611 and is substantially orthogonal to the second busbar longitudinal axis 61512, 61612. The busbar intermediate section transverse axis 615*q*3, 616*q*3 is substantially orthogonal to the busbar intermediate section longitudinal axis 61513, 61613. The busbar intermediate section transverse axis 615$q$3, 61693 is substantially orthogonal to the first busbar longitudinal axis 61511, 61611 and is substantially orthogonal to the second busbar longitudinal axis 61512, 61612.

Figure 12:
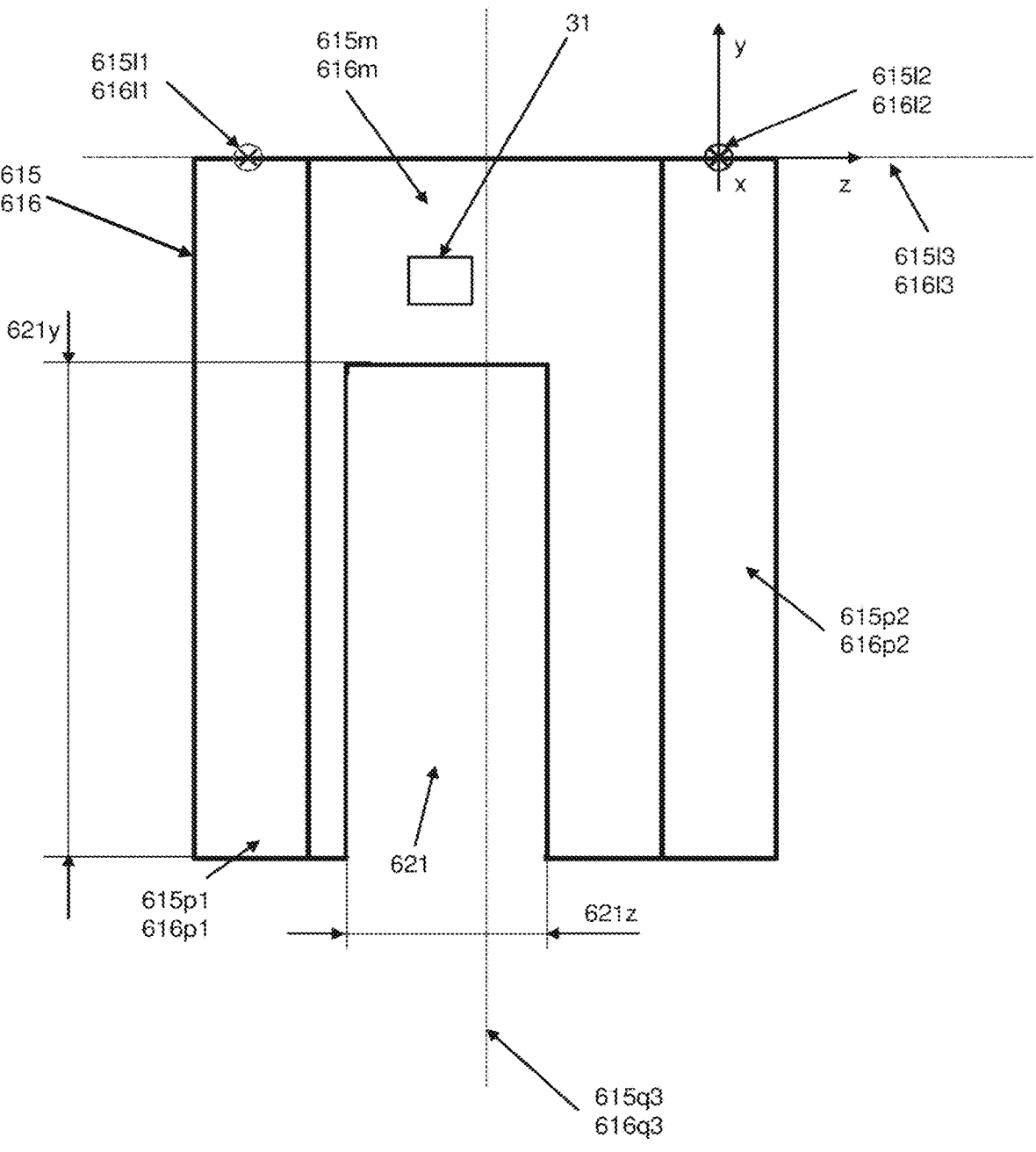
FIG. 12 shows a configuration of the third aspect of the sensor arrangement shown in FIG. 11.

FIG. 12 shows a configuration of the third aspect form of the sensor device 610 shown in FIG. 11. The sensor device 610 further comprises at least one first magnetic field sensor 31. The at least one first magnetic field sensor 31 is arranged at the busbar intermediate section 615$m$, 616$m$. Preferably, the sensor device 610 is arranged on the busbar intermediate section 615$m$, 616$m$ using an/the entire surface of the sensor device 610.

In the sensor device 610, the busbar intermediate section 615$m$, 616$m$ preferably comprises a first recess 621. This recess 621 of the busbar intermediate section 615$m$, 616$m$ extends substantially along the busbar intermediate section transverse axis 615$q$3, 616$q$3. In this configuration of the fifth aspect, the magnetic field sensor 31 is arranged on a region of busbar intermediate section 615$m$, 616$m$ that does not include the recess 621.

Figure 13:
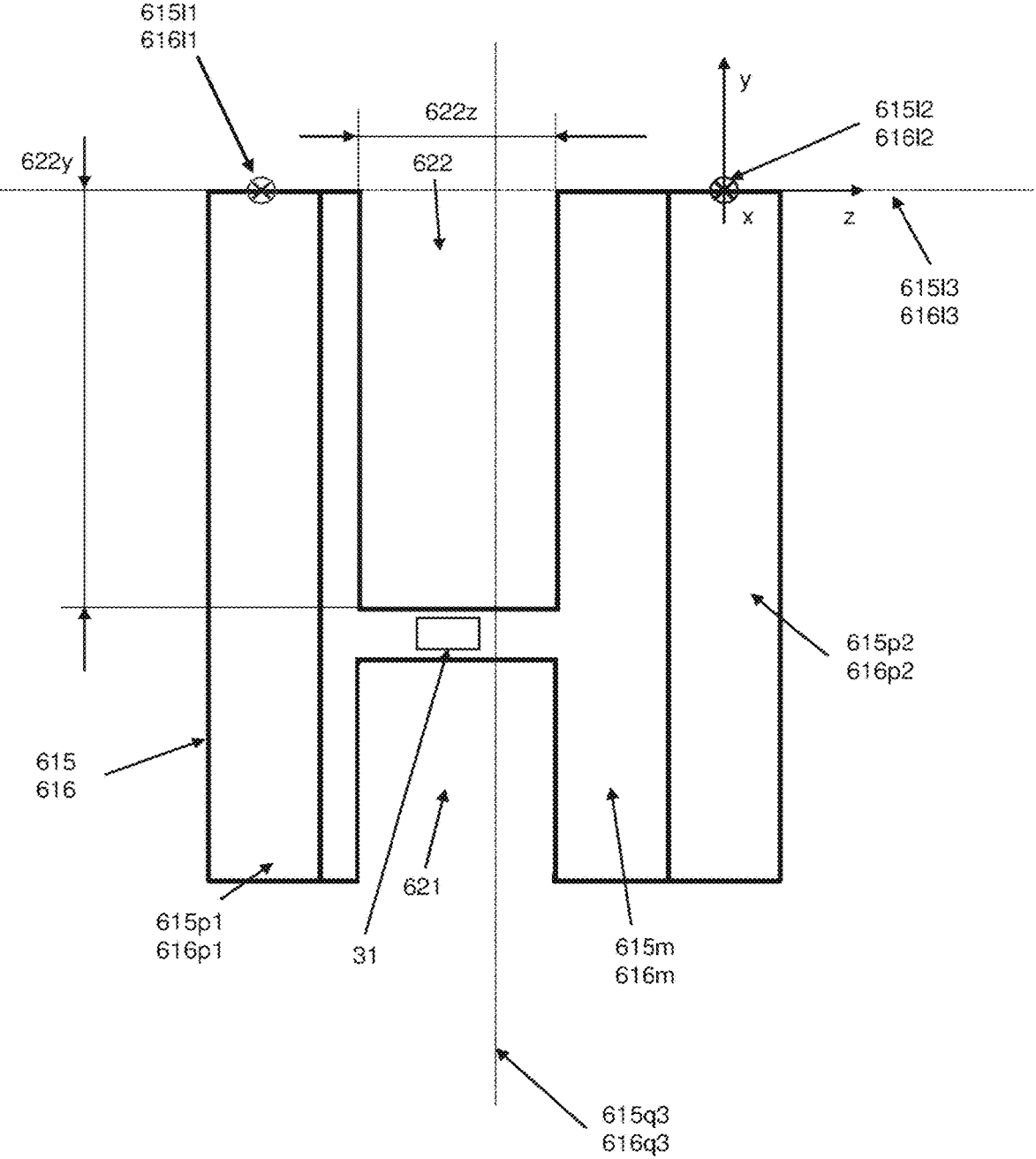
FIG. 13 shows another configuration of the third aspect form of the sensor device shown in FIG. 11 and FIG. 12.

FIG. 13 shows a further configuration of the third aspect of the sensor device 610 shown in FIG. 11 and FIG. 12. In the sensor device 610, the busbar intermediate section 615$m$, 616$m$ particularly preferably comprises the first recess 621 and a second recess 622. This second recess 622 extends substantially along the busbar intermediate section transverse axis 615$q$3, 616$q$3. In this particularly preferred configuration of the fifth aspect, the magnetic field sensor 31 is arranged on a region busbar intermediate section 615$m$, 616$m$ that does not include the recess 621 and the recess 622. For example, the magnetic field sensor 31 is arranged on a region of busbar intermediate section 615$m$, 616$m$ between the first recess 621 and the second recess 622.

Figure 14:
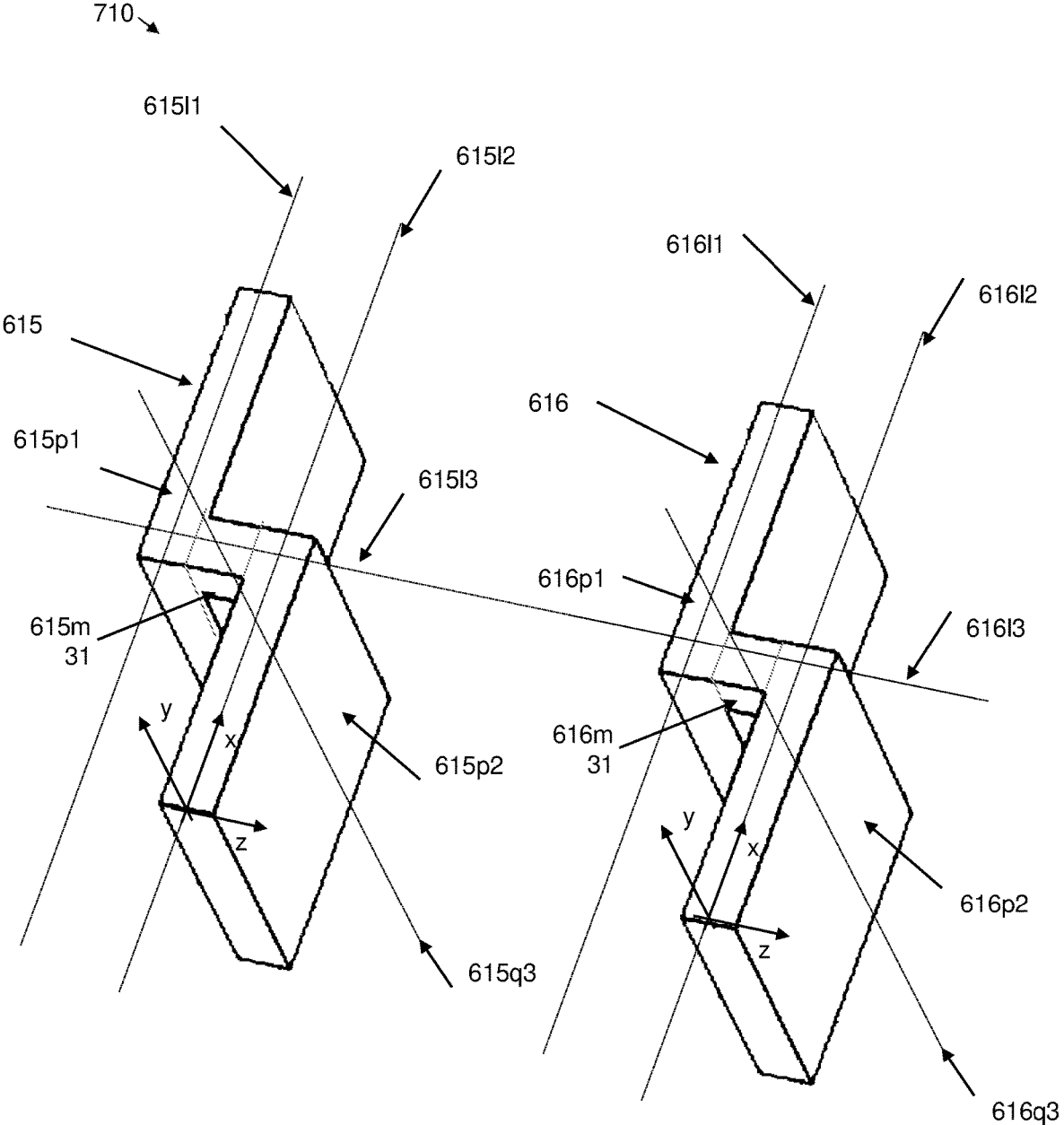
FIG. 14 shows a fifth aspect of a sensor device for determining an electrically induced magnetic field in a first busbar and a second busbar.

FIG. 14 shows a fifth aspect of a sensor arrangement 710 for determining an electrically induced magnetic field in a first busbar 615 and a second busbar 616. The sensor arrangement 710 has a first busbar 615, a second busbar 616, and at least one first magnetic field sensor 31. The first busbar 615 substantially corresponds to the second busbar 616. The first busbar 615 has a first busbar section 615$p$1, a second busbar section 615$p$2, and a busbar intermediate section 615$m$. The busbar intermediate section 615$m$ of the first busbar 615 is arranged between the first busbar section 615$p$1 and the second busbar section 615$p$2. The second busbar 616 has a first busbar section 616$p$1, a second busbar section 616$p$2, and a busbar intermediate section 616$m$. The busbar intermediate section 616$m$ of the second busbar 616 is arranged between the first busbar section 616$p$1 and the second busbar section 616$p$2.

The first busbar section 615$p$1 of the first busbar 615 has a first busbar longitudinal axis 61511. The second busbar section 615$p$2 of the first busbar 615 has a second busbar longitudinal axis 61512. The first busbar section 616$p$1 of the second busbar 616 has a first busbar longitudinal axis 61611. The second busbar section 616$p$2 of the second busbar 616 has a second busbar longitudinal axis 61612.

In the sensor arrangement 710 of the fifth aspect, the first busbar longitudinal axis 61511 of the first busbar 615, the first busbar longitudinal axis 61611 of the second busbar 616, the second busbar longitudinal axis 61512 of the first busbar 615, and the second busbar longitudinal axis 61612 of the second busbar 616 are substantially parallel to each other.

Further, in the sensor arrangement 710 of the fifth aspect, the first busbar longitudinal axis 61511 of the first busbar

615, the first busbar longitudinal axis 61611 of the second busbar 616, the second busbar longitudinal axis 61512 of the first busbar 615, and the second busbar longitudinal axis 61612 of the second busbar 616 are different from each other.

Further, in the sensor arrangement 710 of the fifth aspect, the busbar intermediate section 615$m$ of the first busbar 615 has a busbar intermediate section longitudinal axis 61513 and a busbar intermediate section transverse axis 615$q$3. The busbar intermediate section 616$m$ of the second busbar 616 has a busbar intermediate section longitudinal axis 61613 and a busbar intermediate section transverse axis 616$q$3. The busbar intermediate section longitudinal axis 61513 of the first busbar 615 is substantially parallel to the busbar intermediate section longitudinal axis 61613 of the second busbar 616.

In a preferred configuration of the sensor arrangement 710 according to the fifth aspect, the busbar intermediate section longitudinal axis 61513 of the first busbar 615 is congruent with the busbar intermediate section longitudinal axis 61613 of the second busbar 616.

The at least one first magnetic field sensor 31 is arranged in the sensor arrangement 710 according to the fifth aspect on at least one of the busbar intermediate section 615$m$ of the first busbar 615 and the busbar intermediate section 616$m$ of the second busbar 616. This makes it possible to determine the electrically induced magnetic field in the first busbar 615 or the second busbar 616. The at least one first magnetic field sensor 31 is arranged on one of the busbar intermediate section 615$m$ of the first busbar 615 and the busbar intermediate section 616$m$ of the second busbar 616 using an/the entire surface of the at least one magnetic field sensor 31.

In another configuration of the sensor arrangement 710 according to the fifth aspect, the sensor arrangement 710 further comprises a second magnetic field sensor 32. The at least one second magnetic field sensor 32 is arranged on the other one of the busbar intermediate section 615$m$ of the first busbar 615 and the busbar intermediate section 616$m$ of the second busbar 616. If the sensor arrangement 710 of the fifth aspect comprises the first magnetic field sensor 31 and the second magnetic field sensor 32, the accuracy of the measurement of the magnetic field strength of the magnetic field B is further increased using differential measurement of the magnetic field strength.

Moreover, in the event of failure or malfunction of one of the first magnetic field sensor 31 or the second magnetic field sensor 32, measurement of the magnetic field strength of the magnetic field B at the first busbar 615 or the second busbar 616 can still be performed. Furthermore, the differential measurement can reduce an influence of the external fields on the measurement result. This redundant arrangement can, for example, contribute to the safety of the sensor arrangement 710.

What is claimed is:

1. A sensor arrangement for determining an electrically induced magnetic field, the sensor arrangement consisting of a first busbar, a second busbar and a first magnetic field sensor, wherein:

the first busbar having a busbar longitudinal axis, a first busbar surface, and at least a first recess and a second recess, wherein the first recess and the second recess extend substantially orthogonal to the busbar surface, and wherein the first recess and the second recess are spaced apart from each other along the busbar longitudinal axis;

a second busbar having a busbar longitudinal axis, a first busbar surface, and at least a third recess and a fourth recess, wherein the third recess and the fourth recess extend substantially orthogonal to the first busbar surface, and wherein the third recess and the fourth recess are spaced apart from each other along the busbar longitudinal axis; and the first magnetic field sensor arranged on at least one of the first busbar surface of the first busbar or the first busbar surface of the second busbar, wherein the first magnetic field sensor is arranged on the first busbar surface of the first busbar using an entire surface of the first magnetic field sensor facing the first busbar, or wherein the first magnetic field sensor is arranged on the first busbar surface of the second busbar using the entire surface of the first magnetic field sensor facing the second busbar.

2. The sensor arrangement according to claim 1, wherein the first recess and the second recess extend substantially orthogonal to the first busbar longitudinal axis; and wherein the third recess and the fourth recess extend substantially orthogonal to the second busbar longitudinal axis.

3. The sensor arrangement according to claim 1, wherein the first recess extends substantially parallel to the second recess; and the third recess extends substantially parallel to the fourth recess.

4. The sensor arrangement according to claim 1, wherein the first recess, the second recess, the third recess and the fourth recess extend substantially parallel.

5. The sensor arrangement according to claim 1, wherein the first recess and the third recess are arranged along a first axis; and wherein the second recess and the fourth recess are arranged along a second axis.

6. The sensor arrangement according to claim 5, wherein, the first axis is parallel to the second axis; and wherein the first axis is different from the second axis.

7. The sensor arrangement according to claim 1, wherein the first magnetic field sensor comprises at least one of a Hall sensor element, a magnetoresistive sensor element, or a fluxgate sensor element.

8. A method of using a sensor device according to claim 1 for determining an electrically induced magnetic field.

9. A sensor arrangement for determining an electrically induced magnetic field, the sensor arrangement consisting of:

a first busbar having a first busbar section, a second busbar section, and a busbar intermediate section, the busbar intermediate section being arranged between the first busbar section and the second busbar section;

a second busbar having a first busbar section, a second busbar section, and a busbar intermediate section, the busbar intermediate section being arranged between the first busbar section and the second busbar section; and at least one first magnetic field sensor, the at least one first magnetic field sensor being arranged on at least one of the busbar intermediate section of the first busbar and the busbar intermediate section of the second busbar, wherein the busbar intermediate section of the first busbar has a busbar intermediate section longitudinal axis and a busbar intermediate section transverse axis, the busbar intermediate section of the second busbar has a busbar intermediate section longitudinal axis and a busbar intermediate section transverse axis, wherein the busbar intermediate section longitudinal axis of the first busbar is substantially parallel to the busbar intermediate section longitudinal axis of the second busbar, and wherein the busbar intermediate section longitudinal axis of the first busbar is coincident with the busbar intermediate section longitudinal axis of the second busbar.

10. The sensor arrangement according to claim 9, wherein the first busbar section of the first busbar has a first busbar longitudinal axis;

the second busbar section of the first busbar has a second busbar longitudinal axis;

the first busbar section of the second busbar has a first busbar longitudinal axis; and the second busbar section of the second busbar has a second busbar longitudinal axis.

11. The sensor arrangement according to claim 10, wherein, the first busbar longitudinal axis of the first busbar, the first busbar longitudinal axis of the second busbar, the second busbar longitudinal axis of the first busbar, and the second busbar longitudinal axis of the second busbar are substantially parallel to each other; and wherein first busbar longitudinal axis of the first busbar, the first busbar longitudinal axis of the second busbar, the second busbar longitudinal axis of the first busbar, and the second busbar longitudinal axis of the second busbar are different from each other.

12. The sensor arrangement according to claim 9, further comprising:

at least one second magnetic field sensor, wherein the at least one second magnetic field sensor is arranged at the other one of the busbar intermediate section of the first busbar and the busbar intermediate section of the second busbar.

* * * * *